(12) United States Patent
Otsuga et al.

(10) Patent No.: US 8,339,190 B2
(45) Date of Patent: Dec. 25, 2012

(54) SEMICONDUCTOR INTEGRATED CIRCUIT AND ELECTRONIC DEVICE

(75) Inventors: Kazuo Otsuga, Kokubunji (JP); Yusuke Kanno, Kodaira (JP); Yoshio Takazawa, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 148 days.

(21) Appl. No.: 13/012,881

(22) Filed: Jan. 25, 2011

(65) Prior Publication Data

US 2011/0181337 A1 Jul. 28, 2011

(30) Foreign Application Priority Data

Jan. 25, 2010 (JP) .................. 2010-013304

(51) Int. Cl.
*G05F 1/10* (2006.01)
(52) U.S. Cl. ...................... 327/538; 327/540
(58) Field of Classification Search ................ 327/538, 327/540
See application file for complete search history.

(56) References Cited

U.S. PATENT DOCUMENTS

2008/0129341 A1 6/2008 Mochizuki

FOREIGN PATENT DOCUMENTS

JP 2008-141013 A 6/2008

OTHER PUBLICATIONS

Elgebaly et al, "Variation-Aware Adaptive Voltage Scaling System", IEEE Transactions on Very Large Scale Integration (VLSI) Systems, vol. 15, No. 5, May 2007, pp. 560-571.
Eisele et al., "The Impact of Intra-Die Device Parameter Variations on Path Delays and on the Design for Yield of Low Voltage Digital Circuits", IEEE Transactions on Very Large Scale Integration (VLSI) Systems, vol. 5, No. 4, Dec. 1997, pp. 360-368.

*Primary Examiner* — Kenneth B. Wells
(74) *Attorney, Agent, or Firm* — Miles and Stockbridge P.C.

(57) ABSTRACT

AVS (Adaptive Voltage Scaling) technique, by which variability and uncertainty are both taken into account. In the system arranged for AVS technique, a detection circuit optimum for each type of process variation is set. Examples of the detection circuit so arranged include a first measurement circuit for detection of variability, which produces a relative value with respect to the gate delay mean value, and a second measurement circuit for detection of uncertainty, which produces a relative value related to the gate delay standard deviation. The first and second measurement circuits are provided separately from each other. The control information for deciding the supply voltage is prepared based on relative values produced by the detection circuits. When preparing the control information, reference is made to e.g. a table data.

19 Claims, 13 Drawing Sheets

MVC: Maximum value of the counter

NUMBER OF RING OSCILLATOR PAIRS

Fig.12

| | | Relative value of variability<br>Output value of the first measurement circuit<br>fs($u$) | | |
|---|---|---|---|---|
| | | Slow<br>($u > u_{slow}$) | Typical<br>($u_{slow} > u$<br>$> u_{fast}$) | Fast<br>($u_{fast} > u$) |
| Relative value of uncertainty<br>Output value of the second measurement circuit<br>fr($\sigma$) | Small<br>($\sigma_{small} > \sigma$) | $V_{slow\_small}$ | $V_{typical\_small}$ | $V_{fast\_small}$ |
| | Medium<br>($\sigma_{large} >$<br>$\sigma > \sigma_{small}$) | $V_{slow\_medium}$ | $V_{typical\_medium}$ | $V_{fast\_medium}$ |
| | Large<br>($\sigma > \sigma_{large}$) | $V_{slow\_large}$ | $V_{typical\_large}$ | $V_{fast\_large}$ |

ND    OD

| Required performance | HIGH (800MHz) | NORMAL (400MHz) | LOW (200MHz) |
|---|---|---|---|
| Relative value of variability | ≥ Sh | ≥ Sa | ≥ Sl |
| Relative value of uncertainty | ≤ Rh | ≤ Ra | ≤ Rl |

SEMICONDUCTOR INTEGRATED CIRCUIT AND ELECTRONIC DEVICE

CLAIM OF PRIORITY

The Present application claims priority from Japanese application JP 2010-013304 filed on Jan. 25, 2010, the content of which is hereby incorporated by reference into this application.

FIELD OF THE INVENTION

The present invention relates to a semiconductor integrated circuit and an electronic circuit having the same. Particularly it relates to an AVS (Adaptive Voltage Scaling) technique for controlling a supply voltage to correct the fluctuation of the operation speed owing to the gate delay.

BACKGROUND OF THE INVENTION

For reduction in power consumption demanded of SoC (System On a Chip) used in mobile phones, it is important to lower a supply voltage. However, with the scale-down of semiconductor processes, the leak current and process variations increase, and it is becoming difficult to lower the supply voltage. Under the circumstances, the AVS technique which enables each chip to be supplied with an optimum supply voltage depending on the process variation is in the spotlight. According to the AVS technique, the supply voltages are controlled so that the average gate delay variations of chips, namely the performances thereof, are uniform. For instance, in the case of a chip such that the process variation causes the gate delay to deviate from the center value to the faster or smaller side, the gate delay is corrected and shifted to the slower side by lowering the supply voltage. In contrast, in the case of a chip such that the process variation causes the gate delay to deviate from the center value to the slower or larger side, the gate delay is corrected and shifted to the faster side by raising the supply voltage. Applying an optimum supply voltage to each chip according to the process variation in this way, the reduction of power consumption can be achieved with no performance penalty. In addition to the correction of process variations, the AVS technique is applicable to the correction of gate delay variations caused by a temperature change, power-source noise in operation, and the aging of a device. In the light of the trend that the progress of scale-down of the future will enlarge the process variations, the AVS technique is regarded as indispensable. The detailed description of the AVS technique is presented by Mohamed Elgebaly et al., "Variation-Aware Adaptive Voltage Scaling System", IEEE TRANSACTIONS ON VERY LARGE SCALE INTEGRATION (VLSI) SYSTEMS, VOL. 15, No. 5, May 2007, pp. 560-571.

In general, process variations are broadly classified into an inter-die or Global variation and an intra-die or Local variation according to the types. The inter-die variation is considered to be attributed to a temperature gradient on a wafer occurring in course of manufacture, a fabrication error owing to the variation of the optical path difference from a stepper to a wafer, arising in the process of lithography, or a systematic phenomenon like the dependence on a layout pattern. The inter-die variation has the feature that it changes gently in the surface of a wafer in quantity. In performing the adaptive voltage scaling on each chip, the supply voltage is controlled so that the mean value of gate delay of each chip is made constant, and then the inter-die variation is corrected on the assumption that the magnitude of the inter-die variation is substantially uniform in a chip. The inter-die variation is hereinafter referred to as "variability".

On the other hand, the intra-die variation is considered to be attributed to an impurity density of a substrate varying in transistors. The intra-die variation has the feature that the intra-die variation of each transistor has no correlation to those of other transistors. In general, the probability distribution of the amount of gate delay can be expressed in the form of a normal distribution, and therefore, the magnitude of intra-die variation shall be expressed by a standard deviation. Now, the intra-die variation is hereinafter referred to as "uncertainty". The descriptions about the variability and uncertainty are presented by Martin Eisele et al., "The Impact of intra-Die Device Parameter Variations on Path Delays and on the Design for Yield of Low Voltage Digital Circuits", IEEE TRANSACTIONS ON VERY LARGE SCALE INTEGRATION (VLSI) SYSTEMS, VOL. 5, NO. 4, December 1997, pp. 360-368.

The types of process variations targeted for correction according to the AVS technique have been the variability primarily in the past. In such case, a system based on the AVS technique has, in outline, a sensor circuit provided in the chip thereof for measuring a mean value of gate delay, derives the variability from a result output by the sensor circuit, determines, from the value, the value of an optimum supply voltage, and applies the supply voltage to the chip. However, with the technique trend toward a finer structure, it is expected that the magnitude of uncertainty will be enlarged remarkably. Therefore, it is expected that the need to target the uncertainty for correction according to the AVS technique will increase. In this connection, Japanese Unexamined Patent Publication No. JP-A-2008-141013 describes an AVS technique arranged in consideration with both of variability and uncertainty, by which a chip has a plurality of sensor circuits provided therein for measuring a gate delay, and a calculating unit located outside the chip is used to determine the mean value and standard deviation of gate delay from output values of the sensor circuits.

SUMMARY OF THE INVENTION

However, a circuit structure for realizing an AVS technique arranged in consideration with both of variability and uncertainty, and an operating method therefor, which are described in JP-A-2008-141013, have the following three problems. The first problem is that one type of sensor circuits are used to detect both of variability (mean value) and uncertainty (standard deviation $\sigma$). In light of accurately detecting with resources limited in e.g. the circuit scale and the evaluation time, it is rather preferred to prepare sensor circuits exclusively for certain subjects of measurement. Therefore, it is required to prepare an optimum sensor circuit depending on the type of the intended variation.

The second problem is that the magnitude of uncertainty of gate delay is determined outside the chip. In the case of the semiconductor device as described in JP-A-2008-141013, a plurality of sensor circuits are provided inside the chip for measuring an absolute value of uncertainty (standard deviation) of gate delay, results output by the sensor circuits are sent to the outside of the chip, and then a calculating unit outside the chip performs a statistical work on the output results to determine the absolute values of uncertainty. The reason why the statistical work is conducted outside the chip intentionally is that the operation to calculate the absolute value of the standard deviation is complicated and as such, to perform the calculation using an external resource, e.g. a personal computer or LSI tester, is considered to be preferable. In addition, to conduct a dynamic adaptive voltage scaling on a dynamic change of variation of a chip, i.e. a change of variation of a chip incorporated in a system in its actual working condition, it is necessary to know the magnitude of variation on the chip in action.

The last problem is that when determining the variability (mean value) of gate delay and the uncertainty (standard deviation σ) thereof to derive an optimum voltage, only the sum of the mean value and 3σ—the standard deviation σ multiplied by three—is taken into account as the worst value of data path delay, simply. In general, the timing calculation in the design phase is conducted using the STA (Static Timing Analyzer) tool, or recently the SSTA (Statistical Static Timing Analyzer) tool which allows the direct handling of the uncertainty. As a rule, the worst timing condition that the tool handles is usually not the simple condition that the worst value of data path delay is the sum of the mean value and 3σ—the standard deviation σ multiplied by three, but the condition that a clock path and a data path involve uncertainty of different absolute values respectively. Also, the timing calculation in execution of the adaptive voltage scaling must be conducted with the same condition. For instance, under the signal path timing condition that a delay of the first path is smaller than that of the second path, the timing should be calculated using the delay of the first path with a variation added thereto, and the delay of the second path with a variation subtracted therefrom.

It is an object of the invention to realize an AVS technique arranged in consideration of both of variability and uncertainty for solving the above-described problems.

The above and other objects of the invention and novel features thereof will be apparent from the description hereof and the accompanying drawings.

Of embodiments of the invention herein disclosed, a representative one will be described below in outline.

With the system configuration for executing AVS (Adaptive Voltage Scaling) according to the embodiment, a detection circuit optimum for each of types of process variations can be provided. Further, a first measurement circuit for detection of variability, which produces a relative value with respect to the gate delay mean value, and a second measurement circuit for detection of uncertainty, which produces a relative value related to the gate delay standard deviation are provided separately. The control information for deciding the supply voltage is prepared based on the relative values produced by the first and second measurement circuits. When producing the control information, reference is made to e.g. table data.

The effect achieved by the above-described embodiment will be described below in brief.

Because of the first measurement circuit for detection of variability, and the second measurement circuit for detection of uncertainty mounted on a chip separately, both the types of variations can be detected accurately, whereby the supply voltage can be controlled on the chip adaptively. As the control information is prepared by making reference to a table data, the control information can be readily prepared based on the relative values with accuracy as long as results of timing calculations by e.g. STA tool or SSTA tool are reflected on the table data.

BRIEF DESCRIPTION OF THE DRAWINGS

FIG. 12 is a diagram for explaining a data table held by a storing unit of the control-information-preparing circuit, showing correspondences between output values of the first and second measurement circuits under a certain reference supply voltage, and optimum supply voltage values in the system according to the first embodiment;

1. DETAILED DESCRIPTION OF THE PREFERRED EMBODIMENTS

Figure 1:
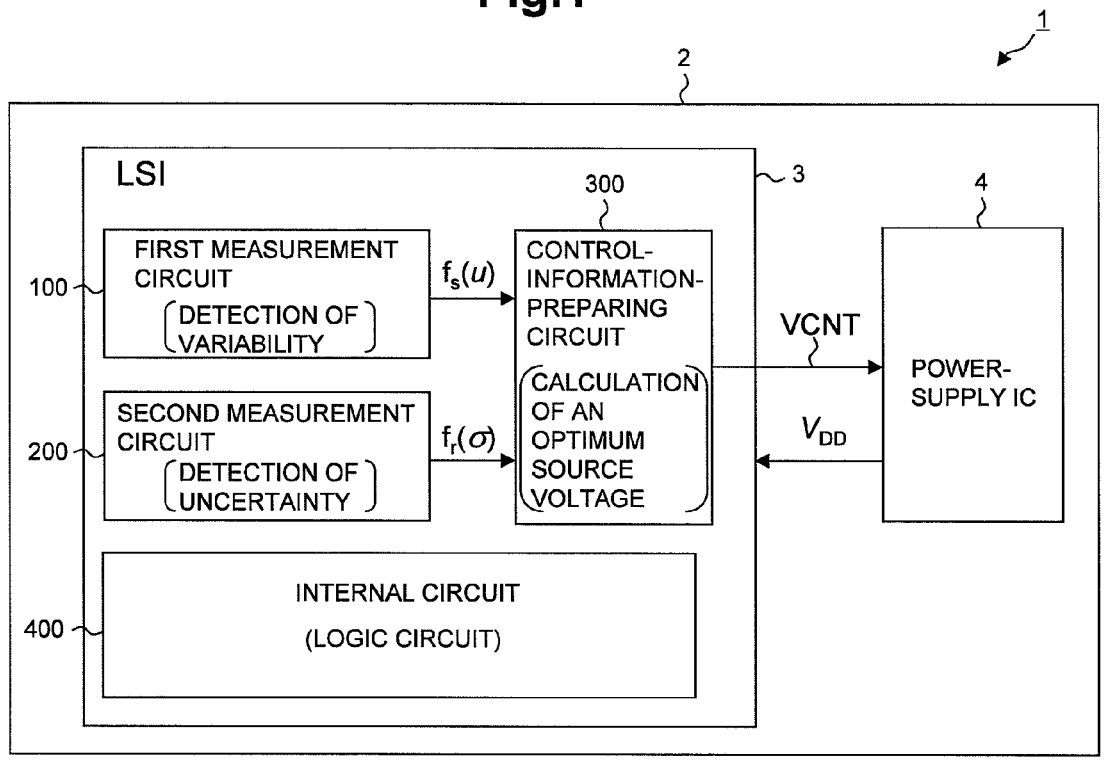
FIG. 1 is a block diagram showing an example of the configuration of a system operable to perform AVS (Adaptive Voltage Scaling) using variability and uncertainty according to the first embodiment of the invention.

The preferred embodiments of the invention herein disclosed will be outlined first. Here, the reference numerals, characters and signs for reference to the drawings, which are accompanied with paired round brackets, only exemplify what the concepts of members, elements, factors referred to by the numerals, characters and signs contain.

[1] A semiconductor integrated circuit according to a preferred embodiment of the invention includes: an internal circuit; a measurement circuit operable to prepare statistical information about a delay depending on a local property of the internal circuit; and a control-information-preparing circuit operable to prepare control information for deciding a supply voltage for the internal circuit based on a result of measurement by the measurement circuit, and the semiconductor integrated circuit is included in a semiconductor chip. In the semiconductor integrated circuit, the measurement circuit includes a first measurement circuit (100) operable to create a relative value (fs(u)) with respect to a gate delay mean value in the internal circuit, and a second measurement circuit (200) operable to create a relative value (fr($\sigma$)) related to a gate delay standard deviation in the internal circuit. Further, the control-information-preparing circuit prepares the control information based on the relative values created by the first and second measurement circuits respectively.

The first measurement circuit for detection of variability and the second measurement circuit for detection of uncertainty are provided separately on a chip, which makes possible to control the supply voltage while accurately detecting both the variability and uncertainty in quantity. Further, the measurement circuit determines a relative value related to a gate delay standard deviation without the need for taking the absolute value of the standard deviation. Therefore, the measurement arranged as described above is suitable for reduction of the circuit scale, and materialization of on-chip mounting thereof. Besides, the adaptive supply voltage control can be performed on the chip, and therefore the adaptive voltage scaling can be readily conducted while adapting to a dynamic change of variation coming from the variability and uncertainty of the chip.

[2] In regard to the semiconductor integrated circuit as described in [1], the first measurement circuit has a first ring oscillator unit (101) for measuring an oscillation frequency used at time of creating a relative value with respect to a gate delay mean value, and the first ring oscillator unit includes a ring oscillator. The second measurement circuit has a second ring oscillator unit (201A, 201B) for measuring an oscillation frequency used at time of creating a relative value related to a gate delay standard deviation, and the second ring oscillator unit includes more than one pair of ring oscillators. Further, a number of delay stages of the ring oscillator of the first measurement circuit is larger than a number of delay stages of each pair of ring oscillators of the second measurement circuit.

According to the above arrangement, the influence of the uncertainty related to the gate delay standard deviation on the relative value produced by the first measurement circuit can be reduced when the first measurement circuit for detection of variability creates a relative value with respect to the gate delay mean value.

[3] In regard to the semiconductor integrated circuit as described in [2], the control-information-preparing circuit holds table data referred to at time of preparing the control information based on the relative values provided by the first and second measurement circuits respectively.

The control-information-preparing circuit refers to the table data, and then prepares the control information. Therefore, as long as results of timing calculation by e.g. STA or SSTA tool have been reflected as the table data, accurate control information can be readily prepared based on the relative values provided by the first and second measurement circuits.

[4] <Default TBL of FIG. 12>

In regard to the semiconductor integrated circuit as described in [3], the control-information-preparing circuit has a non-volatile storage circuit operable to store, as the table data, translation table data (303) to refer to for searching for a value of target voltage fitting conditions specified by the relative values provided by the first and second measurement circuits respectively, using the relative values as indexes at time of activation of the internal circuit using a first supply voltage, and the control-information-preparing circuit sets, as the control information, information of the target voltage value determined as a result of the searching. Thus, an adaptive initial setting of the supply voltage of the semiconductor integrated circuit can be made readily.

[5] In regard to the semiconductor integrated circuit as described in [4], the target voltage becomes higher as the relative value provided by the first measurement circuit becomes smaller, and the target voltage becomes higher as the relative value provided by the second measurement circuit becomes larger. An increase of the relative value with respect to the gate delay mean value represents a decrease of the mean value of the oscillation frequency measured by the ring oscillator unit, and an increase of the relative value related to the gate delay standard deviation represents an increase of the standard deviation of the oscillator frequency measured by the ring oscillator unit.

Figures 15, 16:
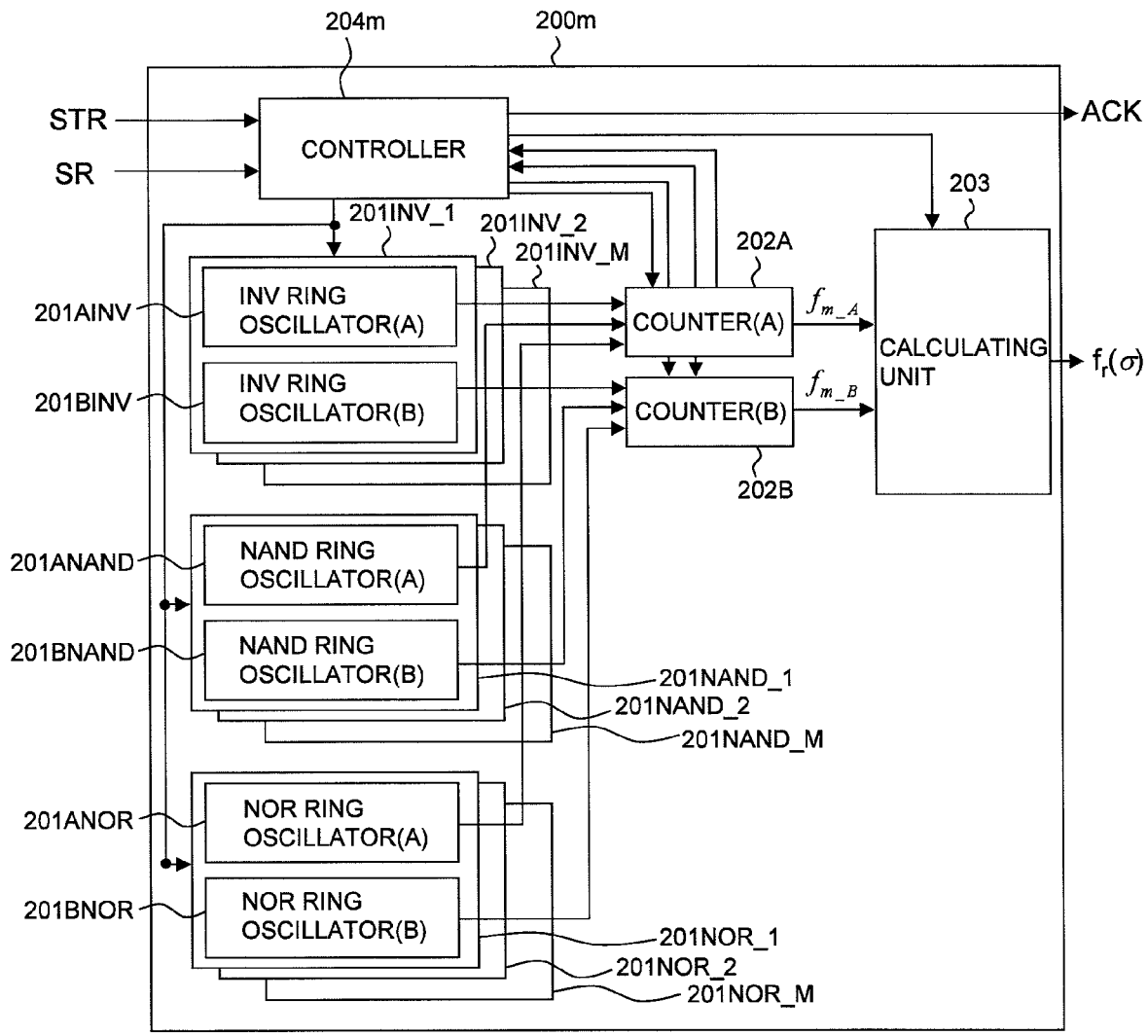
FIG. 15 is a block diagram showing a configuration of the second measurement circuit for measurement of uncertainty in the system according to the second embodiment.
FIG. 16 is a diagram for explaining a data table held by the storing unit of the control-information-preparing circuit operable to calculate an optimum supply voltage, and the data table shows correspondences between performances required of the chip and variations depending on the required performances in the system according to the third embodiment.

[6] <Table TBL for Dynamic Setting of FIG. 16>

In regard to the semiconductor integrated circuit as described in [3], the control-information-preparing circuit has a non-volatile storage circuit operable to store, as the table data, target-value table data (304); in the target-value table data (304), a combination of the relative value provided by the first measurement circuit and the relative value provided by the second measurement circuit, which can achieve a minimum supply voltage necessary for meeting each requirement of speed performance required of the internal circuit, are brought together as target relative values per a plurality of speed performance. The control-information-preparing circuit sets, as the control information, information showing whether or not the relative values provided by the first and second measurement circuits fit requirements of the target relative values of the target-value table data corresponding to a desired processing speed. Thus, it becomes possible to dynamically correct the supply voltage to meet a requirement of a desired speed performance even when a gate delay fluctuation occurs owing to e.g. the temperature fluctuation, power-source noise occurring in a working semiconductor integrated circuit, and the secular change of a property of the semiconductor integrated circuit.

[7] In regard to the semiconductor integrated circuit as described in [6], the target relative value for the relative value provided by the first measurement circuit becomes larger as the required speed performance rises, and the target relative value for the relative value provided by the second measurement circuit becomes smaller as the required speed performance rises. An increase of the relative value with respect to the gate delay mean value represents a decrease of the mean value of the oscillation frequency measured by the ring oscillator unit, and an increase of the relative value related to the gate delay standard deviation represents an increase of the standard deviation of the oscillator frequency measured by the ring oscillator unit. Therefore, if an increased speed performance is required, a smaller gate delay mean value and a smaller standard deviation may suit the requirement.

[8] In regard to the semiconductor integrated circuit as described in each of [4] and [6], the non-volatile storage circuit is composed of one of a semiconductor memory and a programmable-fuse circuit.

[9] <Ring Oscillator Exclusively for Each Logic Gate Type>

In regard to the semiconductor integrated circuit as described in [2], the first ring oscillator unit of the first measurement circuit has ring oscillators including the at least one ring oscillator, and the ring oscillators correspond, in number, to typical logic gate types involved in the internal circuit. Further, the second ring oscillator unit of the second measurement circuit includes groups of ring oscillator pairs including the at least one group of ring oscillator pairs, and the ring oscillator pair groups correspond, in number, to the typical logic gate types. In addition, the first measurement circuit uses an output of one ring oscillator selected from among the ring oscillators located therein, and creates the relative value, and the second measurement circuit uses an output of one ring oscillator pair group selected from among the ring oscillator pair groups located therein, and creates the relative value. According to the arrangement as described above, it is possible to readily process even a case that the gate delay varies depending on the type of a logic gate.

[10] <Dispersed Layout of Pairs of First and Second Measurement Circuits>

In regard to the semiconductor integrated circuit as described in [1], the measurement circuit has more than one pair of the first and second measurement circuits, the control-information-preparing circuit selectively uses one pair of relative values of outputs of the more than one pair of the first and second measurement circuits to prepare the control information, and the selectively used one pair of outputs are the largest in change of variation. By disposing a plurality of pairs of first and second measurement circuits in dispersed places, it becomes possible to readily handle even a case that the gate delay varies depending on a portion of a semiconductor integrated circuit.

[11] <Control of Each Power-Source Domains>

In regard to the semiconductor integrated circuit as described in [1], the semiconductor chip has a plurality of power-source domains which accept supplies of different supply voltages, and each power-source domain has the internal circuit, the measurement circuit, and the control-information-preparing circuit. According to the arrangement as described above, it becomes possible to adaptively control a supply voltage to supply to the power-source domains which need different supply voltages on an individual domain basis.

[12] <External Output of Control Information>

The semiconductor integrated circuit as described in [1], further includes an external interface circuit operable to output the control information to outside the semiconductor chip. According to the arrangement, the control information can be output to the outside, and therefore the power-source circuit located outside the semiconductor integrated circuit is allowed to control the supply voltage based on the control information.

[13] <Control by On-Chip Voltage Regulator>

The semiconductor integrated circuit as described in [1], further includes a voltage regulator which accepts input of an external supply voltage supplied through an external power-source terminal of the semiconductor chip, and generates the supply voltage. The voltage regulator controls the level of the supply voltage with respect to the external supply voltage based on the control information. Thus, the supply voltage can be adaptively controlled using an on-chip regulator of a semiconductor integrated circuit.

[14] In regard to the semiconductor integrated circuit as described in [2], the first measurement circuit has a first ring oscillator, and a counter which accepts input of an oscillating output of the first ring oscillator, counts oscillating outputs in a predetermined cycle, and outputs a counted value resulting from the count-up as a relative value with respect to the gate delay mean value.

Thus, the relative value with respect to the gate delay mean value can be determined by using a mean value of the oscillation frequency measured by the ring oscillator.

[15] In regard to the semiconductor integrated circuit as described in [14], the relative value with respect to the gate delay mean value is given by the following expression, for example:

$$fs(u)=CLKP/(\alpha \times N1 \times u),$$

where fs(u) is the relative value with respect to the gate delay mean value, u is the gate delay mean value, CLKP is the predetermined cycle, N1 is a number of gate stages of the first ring oscillator, and $\alpha$ (=2) is a constant.

[16] In regard to the semiconductor integrated circuit as described in [14], the second measurement circuit has: a plurality of pairs of second ring oscillators; a pair of counters operable to count oscillating outputs of the second ring oscillators of each ring oscillator pair, respectively; a calculating circuit operable to perform a calculation on receipt outputs of the pair of counters; and a control circuit. The control circuit supplies the pair of counters with oscillating outputs of each pair of second ring oscillators while switching among the ring oscillator pairs. The control circuit performs an action to cause the pair of counters to begin a counting action starting with initial values each time of the switching, and the action to cause the pair of counters to begin counting is repeated M times, provided that M is a total number of the ring oscillator pairs. Each time one of the paired counters having started counting reaches a maximum value, the calculating unit logically inverts a counted value that the other counter holds at that time, and determines a relative value related to the gate delay standard deviation based on a value derived by averaging squares of logically inverted values.

Thus, the relative value related to the gate delay standard deviation can be readily obtained by using the logically inverted value of a smaller one of counted values of the oscillation frequency counted using the pairs of ring oscillators. Hence, the need for performing a calculation to determine the absolute value of the standard deviation of oscillation frequencies of the ring oscillators is eliminated.

[17] In regard to the semiconductor integrated circuit as described in [16], the relative value related to the gate delay standard deviation is given by:

$$fr(\sigma)=fbbs/(\beta \times MVC^2 \times M \times N2),$$

where fr($\sigma$) is the relative value related to the gate delay standard deviation, fbbs is the value derived by averaging squares of the logically inverted values, MVC is the maximum value of the counter, N2 is a number of gate stages of the second ring oscillator, and $\beta$ (=4) is a constant.

[18] <Supply Voltage Control at Boot of the Electronic Circuit>

An electronic device according to another embodiment of the invention includes: a mounting board; a semiconductor integrated circuit on the mounting board; a power-source circuit operable to supply a supply voltage to the semiconductor integrated circuit, the power-source circuit mounted on the mounting board. The semiconductor integrated circuit include an internal circuit, a measurement circuit operable to prepare statistical information about a delay depending on a local property of the internal circuit; and a control-information-preparing circuit operable to prepare control information for deciding a supply voltage for the internal circuit based on a result of measurement by the measurement circuit. The internal circuit, measurement circuit, and a control-information-preparing circuit are included in a semiconductor chip. The measurement circuit includes a first measurement circuit operable to create a relative value with respect to a gate delay mean value in the internal circuit, and a second measurement circuit operable to create a relative value related to a gate delay standard deviation in the internal circuit. The control-information-preparing circuit supplies the power-source circuit with information of a target voltage value searched for using a translation table data, as the control information, the translation table data for holding information of target voltage values, which is referred to using, as indexes, the relative values provided by the first and second measurement circuits, at time of activation of the internal circuit using a first supply voltage supplied from the power-source circuit. The power-source circuit supplies the semiconductor integrated circuit with the supply voltage having a voltage value specified by the supplied control information.

According to the arrangement as described above, an adaptive initial setting of a supply voltage for the semiconductor integrated circuit can be performed by using a power-source circuit outside the semiconductor integrated circuit at the boot of the electronic circuit, for example.

[19] <Dynamic Supply Voltage Control of the Electronic Circuit>

An electronic device according to another embodiment of the invention includes: a mounting board; a semiconductor integrated circuit on the mounting board; a power-source circuit operable to supply a supply voltage to the semiconductor integrated circuit, the power-source circuit mounted on the mounting board. The semiconductor integrated circuit include an internal circuit, a measurement circuit operable to prepare statistical information about a delay depending on a local property of the internal circuit; and a control-information-preparing circuit operable to prepare control information for deciding a supply voltage for the internal circuit based on a result of measurement by the measurement circuit. The internal circuit, measurement circuit, and a control-information-preparing circuit are included in a semiconductor chip. The measurement circuit includes a first measurement circuit operable to create a relative value with respect to a gate delay mean value in the internal circuit, and a second measurement circuit operable to create a relative value related to a gate delay standard deviation in the internal circuit. The control-information-preparing circuit has a non-volatile storage circuit operable to store target-value table data. In the target-value table data, a combination of the relative value provided by the first measurement circuit and the relative value provided by the second measurement circuit, which can achieve a minimum supply voltage necessary for meeting each requirement of speed performance required of the internal circuit, are brought together as target relative values per a plurality of speed performance. The control-information-preparing circuit supplies the power-source circuit with, as the control information, information showing whether or not the relative values provided by the first and second measurement circuits fit requirements of the target relative values of the target-value table data corresponding to a desired processing speed. The power-source circuit performs control to change the supply voltage to supply to the semiconductor integrated circuit on condition that the supplied control information shows that the requirement for a target relative value has not been satisfied.

Thus, it becomes possible to dynamically correct the supply voltage of a semiconductor integrated circuit to meet a requirement of a desired speed performance even when a gate delay fluctuation occurs owing to e.g. the temperature fluctuation, power-source noise occurring in the working semiconductor integrated circuit, and the secular change of a property of the semiconductor integrated circuit.

2. FURTHER DETAILED DESCRIPTION OF THE PREFERRED EMBODIMENTS

Now, the embodiments will be described further in detail.

First Embodiment

<<General Configuration of the System>>

FIG. 1 shows an example of the configuration of a system associated with the first embodiment, which executes an adaptive voltage scaling according to the magnitudes of variability and uncertainty—different types of process variations.

The system shown in the drawing is composed of an electronic device 1 including: a semiconductor integrated circuit (LSI) 3 with a number of gates provided therein; a power-supply IC 4 serving as a power-source circuit operable to supply an electric power to LSI 3; and a mounting board 2 on which the power-supply IC 4 is mounted. While only one LSI 3 is shown in the drawing, it typifies more than one LSI. Actually, two or more LSIs required for realizing a given function may be disposed. In such case, the power-supply IC 4 supplies a supply voltage to the LSIs, and what is targeted for adaptive supply-voltage control may be part or all of LSIs. In the case of part of LSIs targeted for adaptive supply-voltage control, a predetermined supply voltage is supplied to the other LSIs.

The LSI 3 includes: a first measurement circuit 100 operable to output a value connected with a mean value u of gate delay, namely a relative value fs(u) with respect to the gate delay mean value u, which serves to detect a correlation of the variability; a second measurement circuit 200 operable to output a value connected with a standard deviation $\sigma$ of gate delay, namely a relative value fr($\sigma$) with respect to the gate delay standard deviation $\sigma$, which serves to detect a correlation of the uncertainty; an optimum-supply-voltage-calculation circuit 300 serving as a control-information-preparing circuit which creates control information for controlling an optimum supply voltage value (VDD) to be applied to the chip based on output values from the measurement circuits; and a logic circuit 400, which is an internal circuit. The LSI 3 is formed on a substrate of semiconductor, e.g. monocrystalline silicon. The internal circuit 400 includes logic circuits for exercising desired functions, e.g. CPU (Central Processing Unit), a moving-picture processing unit, an interrupt processing unit, and a timer. For the sake of simplicity, the supply voltage VDD shall be supplied to LSI 3 generally and commonly.

The system is characterized in that a circuit for detecting a relative value fs(u) with respect to the gate delay mean value u for factoring in the variability involved in process variations, and a detection circuit for detecting a relative value fr(σ) with respect to the gate delay standard deviation σ for figuring in the uncertainty are prepared separately. This is because using detection circuits arranged exclusively for measurement of certain subjects, a highly precise detection can be performed even with resources limited in the circuit scale and the evaluation time. The structure of each detection circuit and the effect thereof will be described below.

<<Measurement of Correlation of the Variability>>

Figure 2:
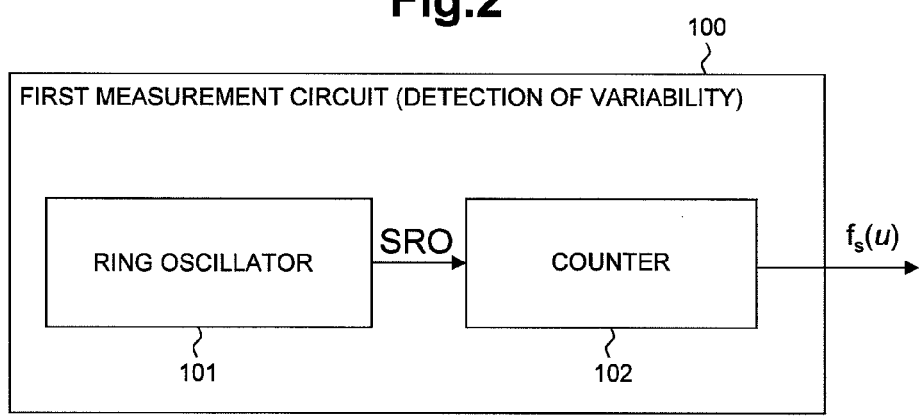
FIG. 2 is a block diagram showing the configuration of a first measurement circuit for measurement of variability in the system according to the first embodiment.

FIG. 2 shows an example of the first measurement circuit 100 for detecting a correlation of the variability. The first measurement circuit 100 includes: a ring oscillator 101 operable to sense a degree of process variation by means of an oscillation frequency thereof; and a counter 102 operable to gauge the oscillation frequency.

Figure 3:
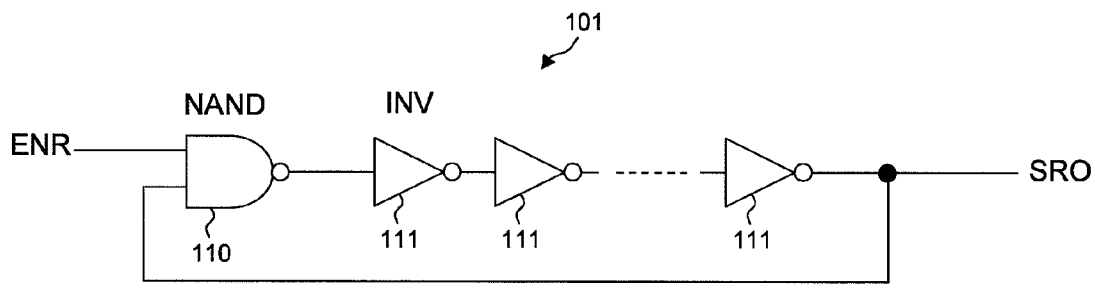
FIG. 3 is a circuit diagram of a ring oscillator included in the first measurement circuit for measurement of variability in the system according to the first embodiment.

FIG. 3 shows an example of the ring oscillator 101. The ring oscillator 101 has a NAND gate 110 and an even number of inverters 111 connected in series, in which an output signal SRO arising in the final stage thereof is fed back to an input of the NAND gate 110 in the first stage. The oscillation of the ring oscillator 101 is controlled by an enable signal ENR; the ring oscillator starts oscillating in response to the change of the enable signal ENR to High level, and stops in response to the change of the enable signal to Low level. As to the circuit action depending on the variability, the oscillation frequency of the ring oscillator 101 is made higher in the case of the gate delay having varied toward the faster or smaller side thereof, whereas it is made lower in the case of the gate delay having varied toward the slower or larger side. The ring oscillator 101 is a circuit for detecting the variability (mean value), on which the influence of uncertainty (standard deviation) must be counteracted to the extent possible. With the structure of the ring structure fitting the intent, it is preferable to increase the number of the inverters 111 connected in series. Letting N be the number of stages which the ring oscillator 101 has generally, including the NAND gate 110, the relative magnitude of the standard deviation $\sigma_f$ with respect to the mean value $u_f$ of the oscillation frequency can be expressed by the following expression:

[Number 1], where u represents the mean value of gate delay corresponding to one stage, referring to the variability, and σ represents the standard deviation referring to the uncertainty.

For the sake of simplicity, the expression is based on the assumption that there is no difference in quantity between the extends to which the NAND gate 110 and the inverter 111 contribute to the gate delay. According to the expression, it is clear that the influence of the uncertainty during observation of the oscillation frequency can be made smaller by increasing the number N of stages.

Figure 4:
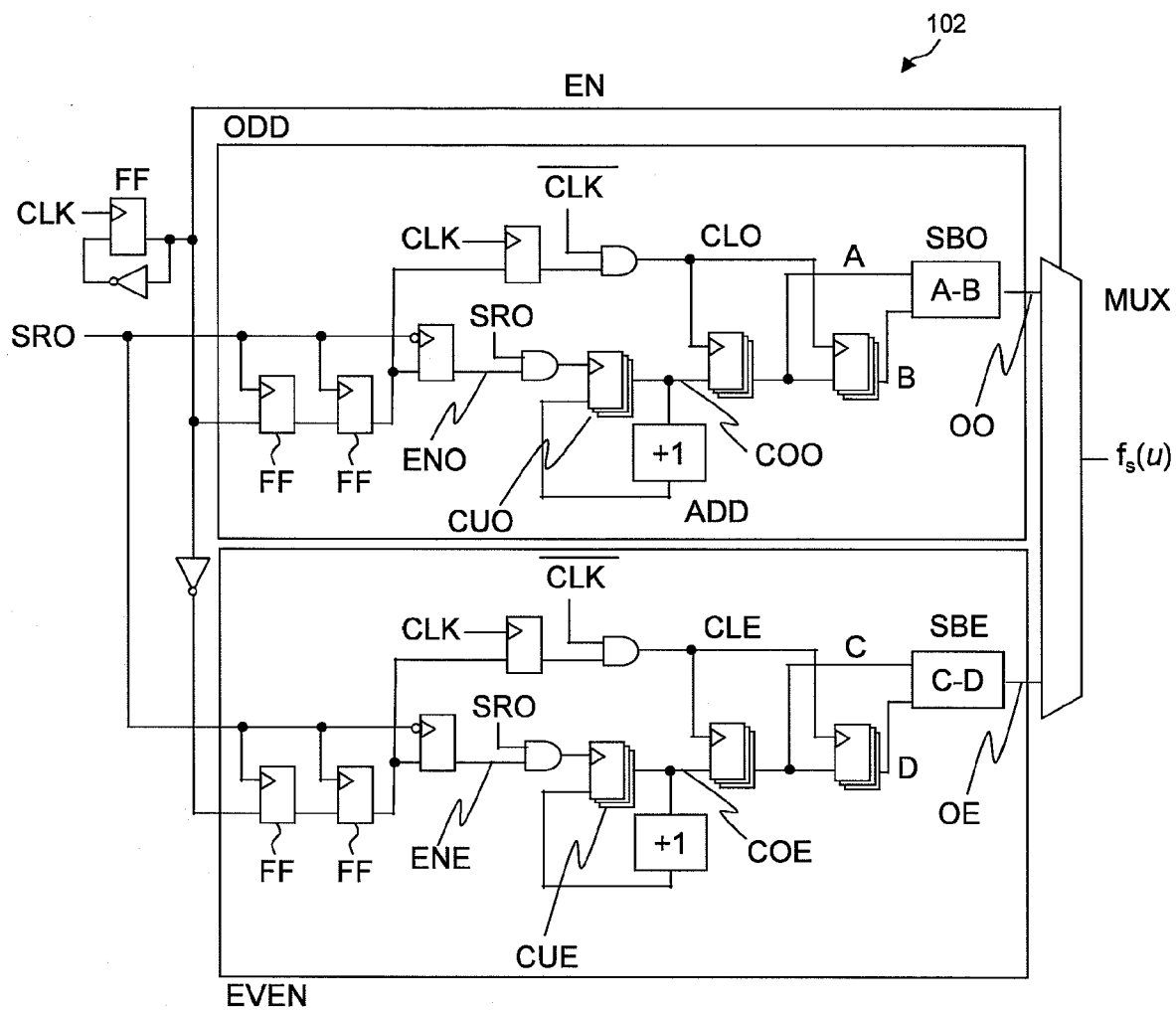
FIG. 4 is a circuit diagram of a counter included in the first measurement circuit for measurement of variability in the system according to the first embodiment.
Figure 5:
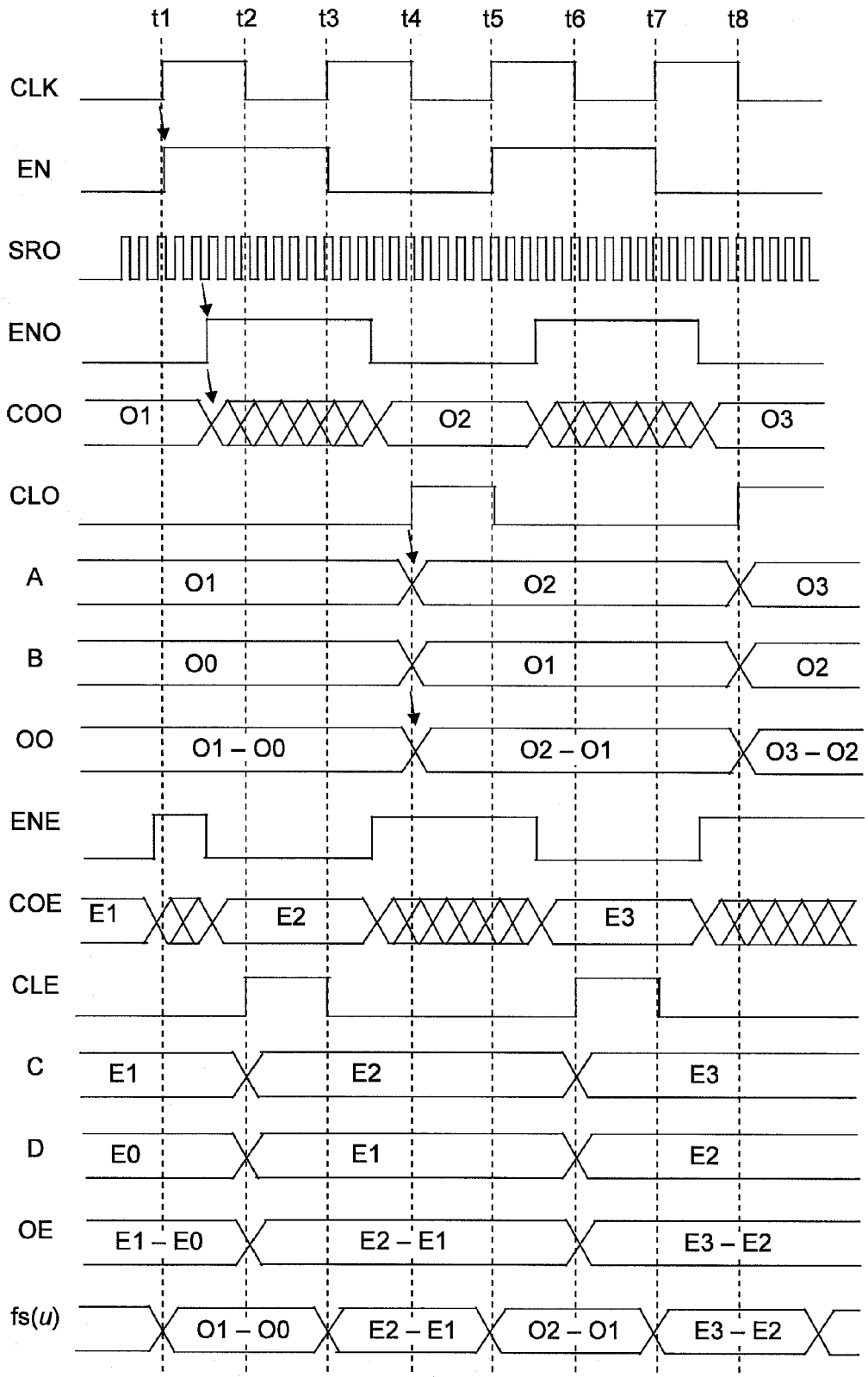
FIG. 5 is a waveform diagram of the circuit action of the counter included in the first measurement circuit for measurement of variability in the system according to the first embodiment.

FIG. 4 shows an example of the counter 102. FIG. 5 shows examples of waveforms of the counter in action. The counter 102 in action counts the number of times the ring oscillator 101 has toggled during the period of one cycle of a reference clock signal CLK, and outputs the resultant value in line with the timing of the reference clock signal CLK as fs(u) successively. The counter is roughly composed of two blocks, i.e. ODD and EVEN blocks. The ODD and EVEN blocks are identical to each other in structure. The reason why the counter having identical two blocks is arranged in this way is to avoid a problem caused by the oscillation frequency of the ring oscillator 101 and the reference clock CLK in asynchronism with each other, and to achieve a high-speed sampling rate. The problem and a method for solving the problem will be described below in brief.

A combination of the register CUO and adder ADD constituting a core portion of the counter 102 counts up by one and outputs the resultant value each time the ring oscillator 101 toggles, and then a register in the subsequent stage accepts and latches the value so output at a rising edge of the clock signal at a node CLO. Specifically, the register CUO works in line with the toggling timing of the ring oscillator 101, whereas the register in the subsequent stage operates in line with the timing of the reference clock CLK, and therefore the registers are in asynchronism with each other. The number of bits of the register CUO, which is coincident with the number of bits at the node COO, represents the maximum value which can be counted during the period of one cycle of the reference clock CLK. There is a timing skew between bits at the node COO, which depends on the layout. The register of the subsequent stage latches a value at the node COO with a certain timing. However, with the combination of the register CUO and adder ADD keeping counting up, the subsequent-stage register can latch wrong data because of the timing skew at the node COO, and the asynchronous relation between the ring oscillator 101 and the reference clock CLK. The cause of this is that with the skew at the node COO, the register of the subsequent stage latches data before part of bits is updated. The phenomenon tends to occur when the time of the count-up substantially coincides with the time of a rising edge arising at the node CLO. The problem can be avoided by temporarily stopping the action of the register CUO at the beginning of latching data at the time of a rising edge arising at the node CLO to eliminate the influence of the skew. However, in such a case, both a period during which sampling is performed, and a period during which no sampling is conducted are created, and thus a high sampling rate can not be achieved. Hence, in regard to counter, the ODD and EVEN blocks identical in structure are arranged so that one of the blocks keeps counting up while the other block remains stopping its count-up action, whereby a right data latching can be performed.

Referring to FIGS. 4 and 5, the action of the counter 102 will be described in detail. A count-up enable signal EN to be fed to ODD and EVEN blocks is prepared by halving the frequency of the reference clock CLK. The description below is concerning the action of the block ODD. The count-up enable signal EN and an output SRO of the ring oscillator 101 are asynchronous to each other in cycle. To avert a trouble of metastable, flip-flops FF of two stages are provided, which latch the count-up enable signal EN in line with the timing of the output SRO of the ring oscillator 101. After the change of the count-up enable signal EN to High level, the signal ENO is turned to High level at the time when a length of time representing two cycles of the output SRO approximately elapses. The core portion of the counter 102 including the register CUO and adder ADD works only in a period of time during which the signal ENO stays at High level. After the change of the count-up enable signal EN to Low level, the signal ENO is turned to Low level at the time when a length of time representing two cycles of the output SRO approximately elapses, and then the core portion of the counter 102 stops working. During the time the core portion of the counter 102 is out of action, the node COO is stable, and right data is latched and output to the node A in response to the uprise of a rising edge of the signal CLO. The number of times of toggling of the oscillation signal SRO per cycle of the reference clock CLK can be determined by the difference between values of signals at the node COO before and after the count-up. The difference-measuring device SBO takes a difference between the value of a signal at the node A (after the count-up) and the value of a signal at the node B (before the count-up), and outputs the result to the node OO. As described above, the way to take the difference between signal values before and after the count-up can eliminate the need for resetting the register CUO each time of sampling, and therefore obviate a reset signal, leading to the increase in ease of control. However, if the way to determine the number of toggling using the difference between signal values before and after the count-up is adopted, the maximum number of toggling per cycle of the reference clock CLK must be below the maximum value of the register CUO. The EVEN block is complementary to ODD block in terms of operation because an inverted count-up enable signal EN is input to EVEN block. Finally, a multiplexer MUX switches between outputs of the ODD and EVEN blocks, whereby an output fs(u) is formed. The latency from the beginning of the operation of the counter 102 and the ring oscillator 101 to the output of the correct number of toggling depends on the timing of the ring oscillator 101 beginning to oscillate with respect to the reference clock CLK. In FIG. 5, the ring oscillator 101 begins to oscillate just before Time t1, and a correct number of toggling is output from Time t5 onward.

Figure 6:
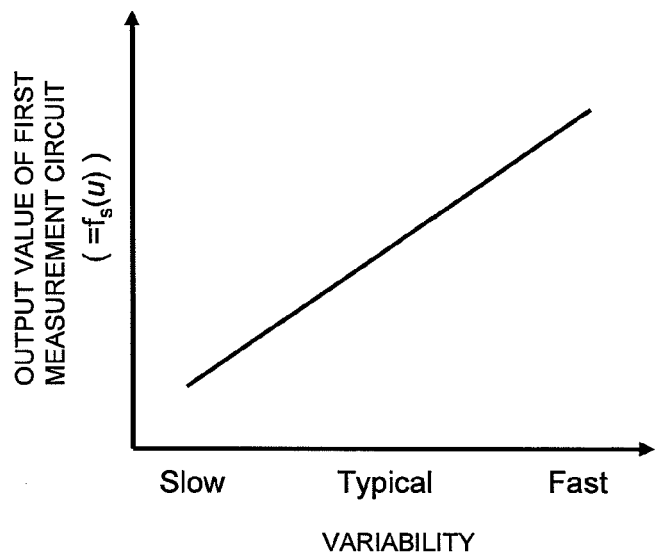
FIG. 6 is a diagram for explanation, showing the mutual dependence of the magnitude of variability, and the output value of the first measurement circuit for measurement of variability.

FIG. 6 shows an example of the mutual dependence of a magnitude of variability and an output value fs(u) of the first measurement circuit. As the variability varies to Fast, i.e. the gate delay varies to the faster side, the output value fs(u) becomes larger. In contrast, as the variability varies to Slow, i.e. the gate delay varies to the slower side, the output value fs(u) becomes smaller. The relation between the mean value u of gate delay, and the output value fs(u) of the first measurement circuit is expressed by:

[Number 2], where CLKP represents a period of one cycle of the reference clock CLK.

<<Measurement of Correlation of the Uncertainty>>

Figure 7:
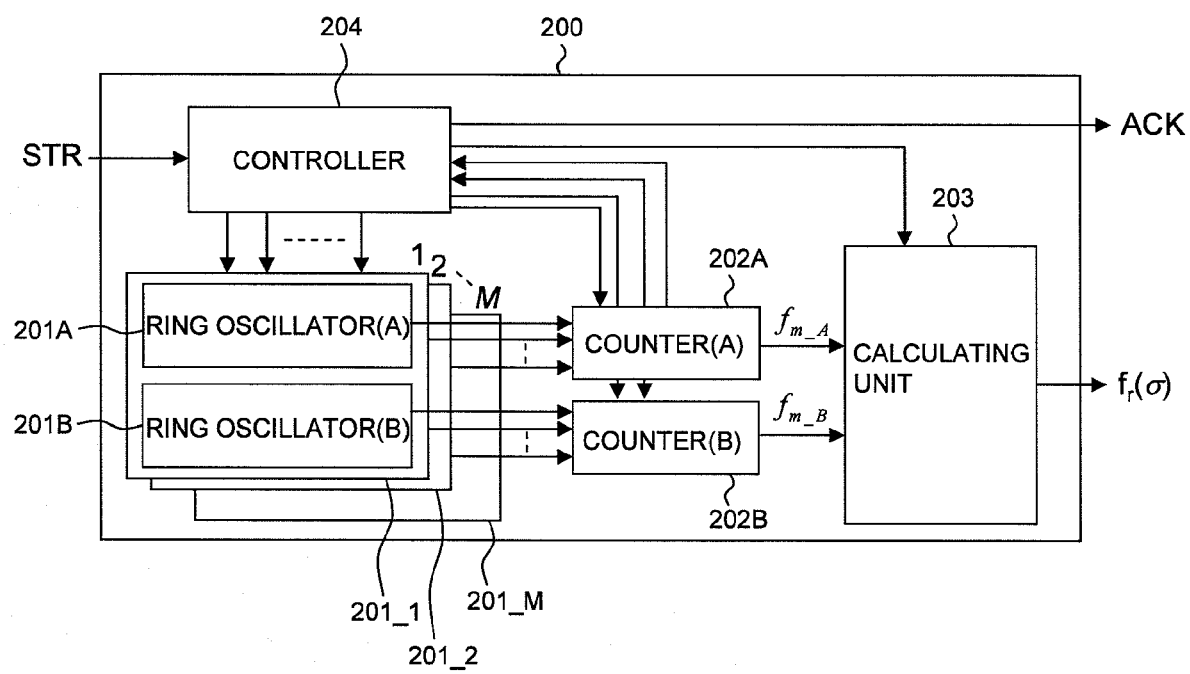
FIG. 7 is a block diagram showing the configuration of a second measurement circuit for measurement of uncertainty in the system according to the first embodiment.
Figure 8:
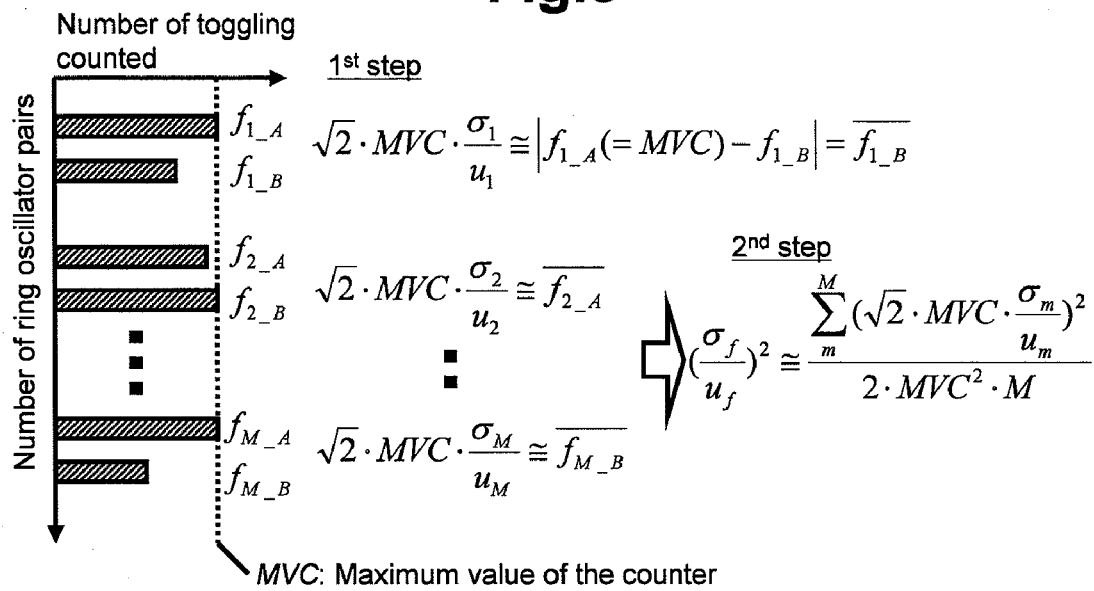
FIG. 8 is a diagram for explaining the way the second measurement circuit for measurement of uncertainty takes the uncertainty in the system according to the first embodiment.

FIG. 7 shows an example of the configuration of the second measurement circuit for measuring the correlation of the uncertainty. FIG. 8 is for explaining the way the second measurement circuit 200 takes a correlation of the uncertainty based on the operation principle.

The second measurement circuit 200 includes: M pairs of ring oscillators, each composed of a ring oscillator (A) 201A and a ring oscillator (B) 201B, also referred to as "ring oscillator pairs" provided that M is a natural number; a counter (A) 202A operable to count up the number of toggling of the ring oscillator 201A; a counter (B) 202B operable to count up the number of toggling of the ring oscillator 201B; a calculating unit 203 operable to perform a calculation to determine a correlation of the uncertainty based on results fm_A and fm_B of counting by the counters 201A and 201B; and a controller 204 operable to control the circuit blocks of the M pairs of ring oscillators, the counter (A) 202A, the counter (B) 202B, the calculating unit 203. Each of the ring oscillators 201A and 201B constituting the M ring oscillator pairs is similar to the ring oscillator shown in FIG. 3 in structure, but smaller in the number of delay stages. In FIG. 7, the M ring oscillator pairs are labeled with the reference numerals 201_1 to 201_M. The counters 202A and 202B count up oscillating outputs of each of the ring oscillator pairs 201_1 to 201_M in pair unit. The controller 204 supplies oscillating outputs of each of the ring oscillator pairs 201_1 to 201_M to the paired counters 202A and 202B while switching among the ring oscillator pairs 201_1 to 201_M in turn. Also, the controller 204 performs an action to cause the paired counters 202A and 202B to begin a counting action starting with initial values each time of the switching, and the action is repeated M times. A main feature of the second measurement circuit 200 is that the measurement circuit determines a value connected with not the absolute value of a standard deviation of the uncertainty, but the relative value thereof. For this purpose, each time one of the paired counters having started counting reaches the maximum value, the calculating unit 203 logically inverts a counted value that the other counter holds, and determines a relative value related to the gate delay standard deviation based on a value derived by averaging squares of logically inverted values. Next, the operation principle will be described with reference to FIG. 8.

The basic algorithm to be described with reference to FIG. 8 performs an operation including the steps of: determining the relative value of a standard deviation with respect to the center value of oscillation frequencies for each of the ring oscillator pairs 201_1 to 201_M; and calculating the mean square value of the relative value for each ring oscillator pair. Now, the detail of the algorithm will be described. To determine the relative value of a standard deviation with respect to the center value of oscillation frequencies of each of the ring oscillator pairs 201_1 to 201_M, it is necessary to count the numbers of toggling of the ring oscillators 201A and 201B using the counters 202A and 202B, in which the control of oscillation of the ring oscillators 201A and 201B is performed as follows. First, the ring oscillators 201A and 201B are caused to start oscillating at the same time. Thereafter, the oscillators 201A and 201B are controlled so that both of the oscillators stop oscillating at the time when one of the oscillators reaches the maximum value MVC of the counters 202A and 202B. In the case of so controlling the ring oscillators 201A and 201B, a value resulting from the inversion of a counter value of the other counter, which has not reached the maximum value MVC, in logic value can be represented as an approximate value of a value derived by multiplying the relative value of a standard deviation with respect to the center value of oscillation frequencies of a ring oscillator pair in process by a constant of √2×MVC−square root of two multiplied by MVC. Next, the reason for this will be explained by mathematical expressions. First, assuming that two ring oscillators are provided, the mean value $u_f$ can be expressed, in general, by:

[Number 3], where $f_A$ and $f_B$ are the numbers of toggling—proportional to the frequency—within a fixed length of time.

The standard deviation can be expressed by:

[Number 4].

Therefore, the relative value of the standard deviation with respect to the mean value can be expressed by:

[Number 5].

This is a correct value, namely a best estimate, not an approximate value. Now, assuming that $f_A$ is larger than $f_B$, and the difference between $f_A$ and $f_B$ is small, the denominator of the expression of $\sigma_f/u_f$ can be replaced with $2 \times f_A$. As a result, the approximate value of the expression of $\sigma_f/u_f$ can be expressed by:

[Number 6].

Now, considering the operation of the second measurement circuit 200, $f_1$ corresponds to the maximum value MVC of the counter according to the method for controlling the oscillation of the ring oscillator pairs 201_1 to 201_M. Therefore, $f_A$ can be replaced with the maximum value MVC. In addition, the numerator of the expression of $\sigma_f/u_f$ is the maximum value of the counter minus $f_B$, and therefore it is equal to a logically inverted value of $f_B$. Finally, the relation presented by the following expression is obtained.

[Number 7]

As described above, in the case of determining the relative value of a standard deviation in regard to each of the ring oscillator pairs 201_1 to 201_M, not the absolute value thereof, the relative value of a standard deviation can be obtained by logically inverting a counter value of one of the counters simply as long as it is accepted that the relative value is an approximate value. In other words, the number of steps of calculation for determining a relative value can be reduced in comparison to that for determining the absolute value. The deviation from a true value, i.e. an error, which is caused by making the approximation can be estimated in quantity by the Monte Carlo simulation or the like. Therefore, the error can be corrected in a later processing. Hence, it is possible to derive the best estimate of the relative value of the standard deviation.

Figure 9:
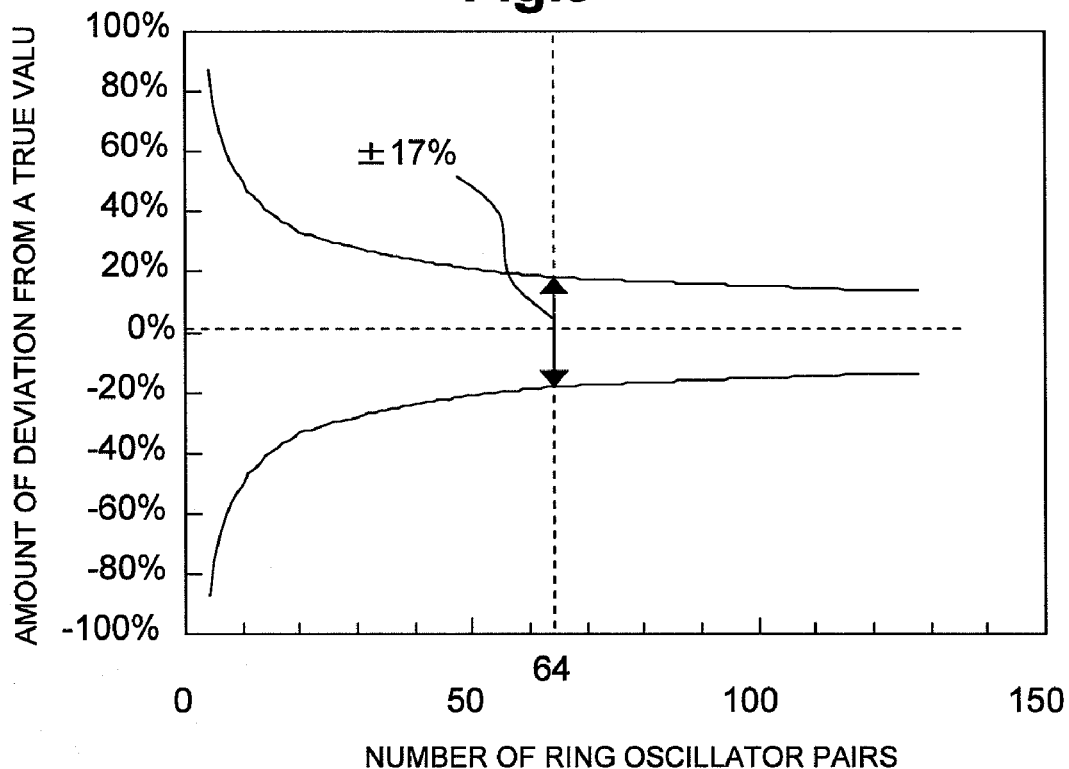
FIG. 9 is a diagram for explaining the relation between the number of ring oscillator pairs of the second measurement circuit for measurement of uncertainty, and the accuracy of a value of variation in the system according to the first embodiment.

With M ring oscillator pairs, a value of variation can be determined with high accuracy by working out a mean square on a value given by the expression. FIG. 9 shows the relation between the number M of ring oscillator pairs and the accuracy of the value of variation, i.e. the magnitude of deviation from a true value. Naturally, the larger the number of the ring oscillator pairs is, the higher the accuracy can be made. However, the accuracy is in the relation of tradeoff with the area that the ring oscillators occupy, and the evaluation time thereof. If the number of ring oscillator pairs is e.g. 64, the accuracy can be raised to ±17%. In addition, the resolution of the second measurement circuit 200 depends on the number of stages of ring oscillators, and the maximum bit number of the counters. To achieve the same resolution, the bit number of the counters may be made smaller with a smaller number of stages of the ring oscillators, however the bit number of the counters must be increased with a larger number of stages of the ring oscillators. It is desirable to minimize the scale of the circuit, and therefore it is better to decrease the number of stages of the ring oscillators to the extent possible.

The action of the second measurement circuit 200 shown in FIG. 7 according to the outline of the operation as described above will be described here. On assert of a start signal STR, the controller 204 disasserts or negates an acknowledge signal ACK, resets the counters 202A and 2023 and an internal register of the calculating unit 203, and then makes the ring oscillators 201A and 201B of the first ring oscillator pair 201_1 start oscillating. After the counter value of one of the counters reaches the maximum, the controller 204 immediately stops the counters 202A and 202B from counting, and the ring oscillators 201A and 201B from oscillating. Then, the controller 204 sends the calculating unit 203 counter values $f_{1\_A}$ and $f_{1\_B}$ of the counters 202A and 202B associated with the ring oscillator pair 201_1. The calculating unit 203 makes a judgment about which of the counter values f1_A and f1_B of the counters 202A and 202B is smaller, inverts the smaller counter value in logical value, squares the logically inverted counter value, and stores the squared value in the register (not shown). Subsequently, the controller 204 resets the counter values of the counters 202A and 202B to the initial values, and makes the ring oscillators 201A and 201B of the ring oscillator pair 202_2 start oscillating. In the same way as described in the case of the ring oscillator pair 202_1, after the counter value of one of the counters 202A and 202B reaches the maximum, the controller 204 immediately stops the counters from counting, and the ring oscillators 201A and 201B of the ring oscillator pair 202_2 from oscillating, and sends the counter values $f_{2\_A}$ and $f_{2\_B}$ of the counters 201A and 201B to the calculating unit 203. The calculating unit 203 makes a judgment about which of the counter values is smaller, inverts the smaller counter value in logical value, squares the logically inverted counter value, calculates the sum of the square and the one already held in the register, and stores the sum thus calculated in the register. The above-described action is repeated until the ring oscillator pair 202_M. In the end, the calculating unit 203 divides the value held in the register by $2 \times MVC^2 \times M$ to produce an output fr(σ) given by:

[Number 8].

Then, the calculating unit 203 asserts the acknowledge signal ACK.

Figure 10:
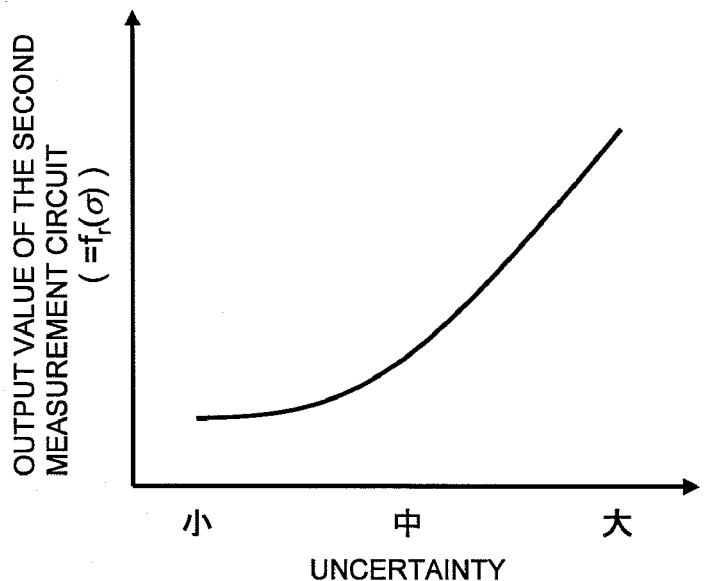
FIG. 10 is a diagram showing the mutual dependence of a magnitude of uncertainty and an output value of the second measurement circuit in the system according to the first embodiment.

As is clear from the expression of fr(σ), the output fr(σ) of the second measurement circuit 200 is substantially equal to the square of the relative value of the standard deviation with respect to the mean value of gate delay divided by twofold the number N of stages of the ring oscillators. FIG. 10 shows the mutual dependence of a magnitude of uncertainty—a type of process variation—and an output fr(σ) of the second measurement circuit. The value of an output fr(σ) of the second measurement circuit is made larger with a larger uncertainty, whereas the value of an output fr(σ) is made smaller with a smaller uncertainty.

As described above, the second measurement circuit 200 is characterized in that the output fr(σ) of the second measurement circuit 200 takes a value connected with not the absolute value of uncertainty, but the relative value. Consequently the method using the second measurement circuit 200 to determine a value connected with the relative value can make smaller the number of steps of calculation and the circuit scale in comparison to the conventional method by which the absolute value is determined. Therefore, the second measurement circuit 200 is very suitable for detecting the value of variation on the chip. Further, the second measurement circuit 200 enables the sensing of uncertainty in real time while the chip is in action.

The circuits 100 and 200 for measuring relative values connected with the variability and a uncertainty respectively have been described above. The circuits 100 and 200 have structures arranged exclusively for variability and uncertainty to be detected. For instance, in regard to the first measurement circuit 100 operable to take a relative value of variability, it is desired that the number of stages of the ring oscillators is made larger for the purpose of excluding the influence of uncertainty. In contrast, as to the second measurement circuit 200 for taking a relative value of uncertainty, it is preferred in the light of the resolution and the circuit scale that the number of stages of the ring oscillators is made smaller. Further, the counters and the calculating unit located downstream of the ring oscillators each have a structure arranged exclusively for the targeted variation. In addition, the first and second measurement circuits 100 and 200 are operated in parallel, whereby variability and uncertainty can be both detected even for a short evaluation time. Therefore, the variations can be detected with fewer resources limited in the circuit scale and the evaluation time accurately by providing measurement circuits arranged exclusively for respective kinds of variations to be detected, rather than using one type of detection circuits to detect correlations of the variability and uncertainty as has been adopt in the art.

<<Calculation of the Optimum Supply Voltage>>

Figure 11:
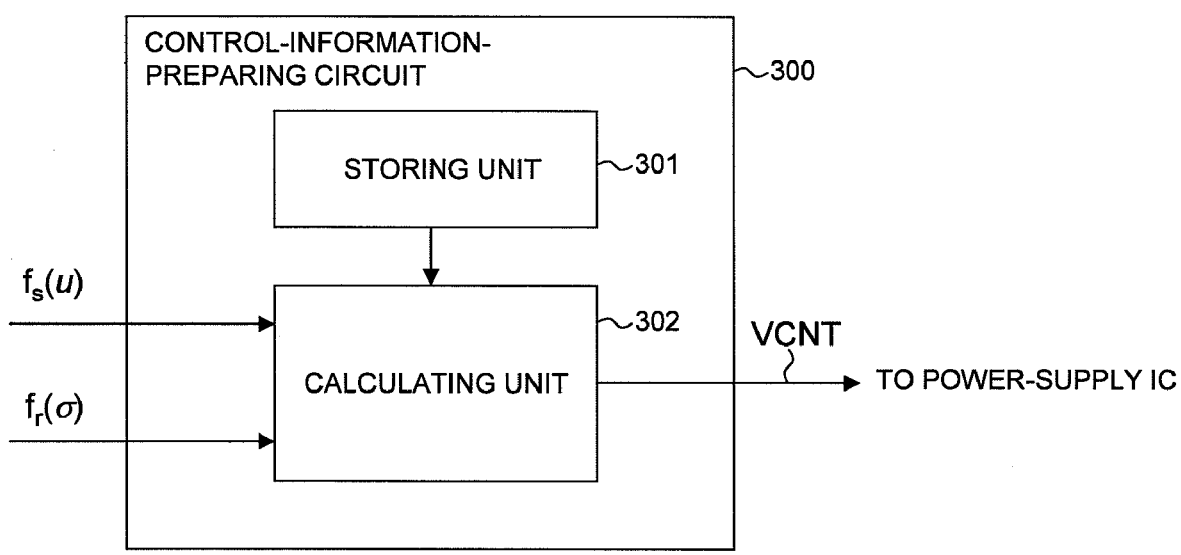
FIG. 11 is a block diagram showing a configuration of the control-information-preparing circuit operable to calculate an optimum supply voltage in the system according to the first embodiment.

FIG. 11 shows an example of the configuration of the control-information-preparing circuit 300. The control-information-preparing circuit 300 includes: a storing unit 301 storing a correspondence table showing correspondences between output values fs(u) and fr(σ) of the measurement circuits 100 and 200, and optimum supply voltage values; and a calculating unit 302 operable to take control information VCNT specifying an optimum value of supply voltage from the correspondence table stored by the storing unit 301, on receipt of the output values fs(u) and fr(σ) from the measurement circuits 100 and 200. The calculating unit 302 provides the control information VCNT to the power-supply IC 4 thereby to direct the power-supply IC 4 to apply the optimum value of supply voltage. The communication with the power-supply IC 4 can be performed by e.g. a specific signal for exclusive use, or through serial communication of I2C, SPI or the like. The interface circuit between the control-information-preparing circuit 300 and the power-supply IC 4 is not shown in the drawing. The storing unit includes of an electrically writable volatile memory, such as a mask ROM (Read Only Memory) or a flash memory, or a programmable-fuse circuit. In the case of the storing unit composed of a mask ROM, the correspondence table is written into the storing unit in the design phase in advance, and the table cannot be rewritten. However, in the case of the storing unit composed of an electrically writable non-volatile memory or a programmable-fuse circuit, it becomes possible to write the correspondence table corrected according to the characteristics of the chip into the storing unit in the phase of testing. The arrangement like this is made because the relations between the oscillation frequency of the ring oscillator and the variations can vary between a chip in the design phase and the actual one. If the storing unit 301 is composed of a non-volatile memory or a programmable-fuse circuit, it becomes possible to grasp relations between the oscillation frequency of the ring oscillator and the variations, and to write, into the storing unit, a correspondence table arranged to adapt to the relations in the phase of testing.

FIG. 12 shows an example of the correspondence table 303 held by the storing unit 301, which shows correspondences between output values fs(u) and fr(σ) of the measurement circuits 100 and 200 under a certain reference supply voltage, and optimum supply voltage values. For instance, the correspondence table 303 is made up of table data which is referred to in the step of preparing the control information based on the relative value fs(u) taken by the first measurement circuit 100 and fr(σ) provided by the second measurement circuit 200.

In regard to the correspondence table 303, three windows are set for each of types of variations coming from the uncertainty and variability, however the number of windows is not particularly limited to three. The three windows for the relative value fs(u) related to the variability are respectively labeled: SLOW for a gate delay mean value u larger than $u_{slow}$; TYPICAL for a gate delay mean value u smaller than $u_{slow}$ and larger than $u_{fast}$; and FAST for a gate delay mean value u smaller than $u_{fast}$. As clearly described above, the smaller the relative value fs(u) is, the larger the gate delay mean value u is. On the other hand, the three windows for the relative value fr(σ) related to the uncertainty are respectively labeled: SMALL for a gate delay standard deviation σ smaller than $σ_{small}$; MEDIUM for a gate delay standard deviation σ larger than $σ_{small}$ and smaller than $σ_{large}$; and LARGE for a gate delay standard deviation σ larger than $σ_{large}$. As clearly described above, the smaller the relative value fr(σ) is, the smaller the gate delay standard deviation σ is.

A voltage value corresponding to each window has been previously determined by the STA or SSTA tool in the design phase. The worst timing condition for the timing calculation executed by STA or SSTA tool is not the simple condition that the worst value of data path delay is the sum of the mean value and 3σ—the standard deviation σ multiplied by three, but the condition that a clock path and a data path involve uncertainties of different absolute values respectively. In other words, it becomes possible to control the supply voltage based on the correct timing calculation in comparison to the case of setting the conventional simple condition that the worst value of data path delay is the sum of the mean value and 3σ—the standard deviation σ multiplied by three. Roughly, there is a tendency among variabilities classified as SLOW based on the gate delay mean value u to need a higher supply voltage value in comparison to variabilities classified as FAST. In addition, there is a trend among uncertainties classified as LARGE based on the gate delay standard deviation σ to need a higher supply voltage value in comparison to uncertainties classified as SMALL.

In a conventional adaptive voltage scaling, measurement is made on variabilities, and thus an optimum voltage depending on the result of the measurement is applied to a chip concerned, during which uncertainties are assumed to have the worst value or a uniform value according to what technology is applied to the chip. The reason why the arrangement like this is made is that uncertainties cannot be sensed on the chip. On this account, a voltage-control range in conventional adaptive voltage scaling extends as shown by the range denoted by the reference character OD of FIG. 12. However, the actual magnitude of uncertainty is in correlation with the magnitude of variability of a chip. Therefore, an originally desired optimum voltage-control range in adaptive voltage scaling should extend as shown by the range denoted by the reference character ND of FIG. 12. According to the invention, relative values of variability and uncertainty of a chip can be measured on the chip, and therefore it is possible to control a supply voltage supplied to the chip while monitoring actual variations that the chip involves. As a result, it becomes possible to control a supply voltage supplied to a chip within a range as shown by the voltage-control range ND of FIG. 12. In the drawing, the voltage $V_{fast\_small}$ is smaller than the voltage $V_{fast\_large}$ and $V_{typical\_medium}$ is smaller than $V_{typical\_large}$. Therefore, it is also possible to achieve a further reduction in supply voltage.

Figure 13:
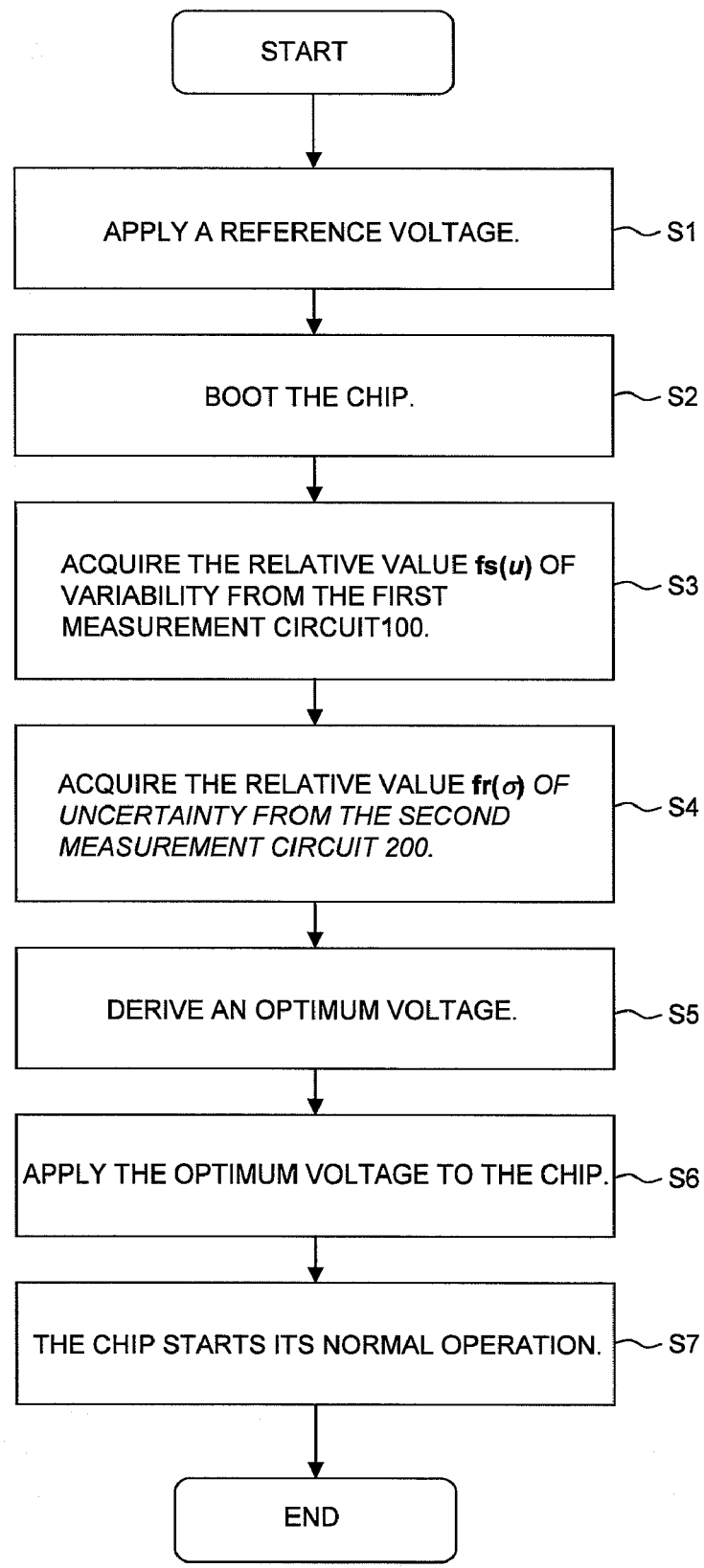
FIG. 13 is a flow chart showing the flow of an operation for executing the AVS according to relative values of variability and uncertainty when booting the chip in the system according to the first embodiment.

FIG. 13 shows an operation flow of the adaptive voltage scaling executed according to relative values of variability and uncertainty when booting the chip of the semiconductor integrated circuit 3.

First, the power-supply IC 4 applies a predetermined reference voltage to the chip (S1). Then, the chip is booted, and an action for initialization under the control of an internal software program, for example, is enabled (S2). After that, the first measurement circuit 100 is first activated in order to measure a relative value of variability, and then a relative value fs(u) of variability is acquired (S3). Subsequently, the second measurement circuit 200 is activated in order to measure a relative value of uncertainty. Then, a relative value fr(σ) of uncertainty is acquired (S4). To save time, the first and second measurement circuits 100 and 200 may be operated in parallel. However, if the action of one of the first and second measurement circuits 100 and 200 can cause e.g. power-source noise, which will negatively affect the result of measurement by the other circuit, it is better to operate the first and second measurement circuits in series in the manner as described with reference to FIG. 13. Based on the relative values fs(u) and fr(σ), the control-information-preparing circuit 300 derives control information for specifying an optimum voltage value (S5). On receipt of the control information, the power-supply IC 4 optimizes a supply voltage VDD to be supplied to the semiconductor integrated circuit 3 according to the control information (S6). Then, the semiconductor integrated circuit 3 begins to work using the optimized supply voltage as its operating power source (S7).

As described above, a structure in which the first measurement circuit 100 for determining a relative value of variability, and the second measurement circuit 200 for determining a relative value of uncertainty are provided independently is adopted for the semiconductor integrated circuit 3 so as to measure process variations in AVS (Adaptive Voltage Scaling), which makes possible to conduct on-chip sensing of variation for each variation type—the uncertainty and variability. As a result, unlike a conventional method based on AVS taking into account only the variability, the supply voltage can be controlled optimally, and the further reduction in power consumed by chips can be achieved.

Second Embodiment

Figure 14:
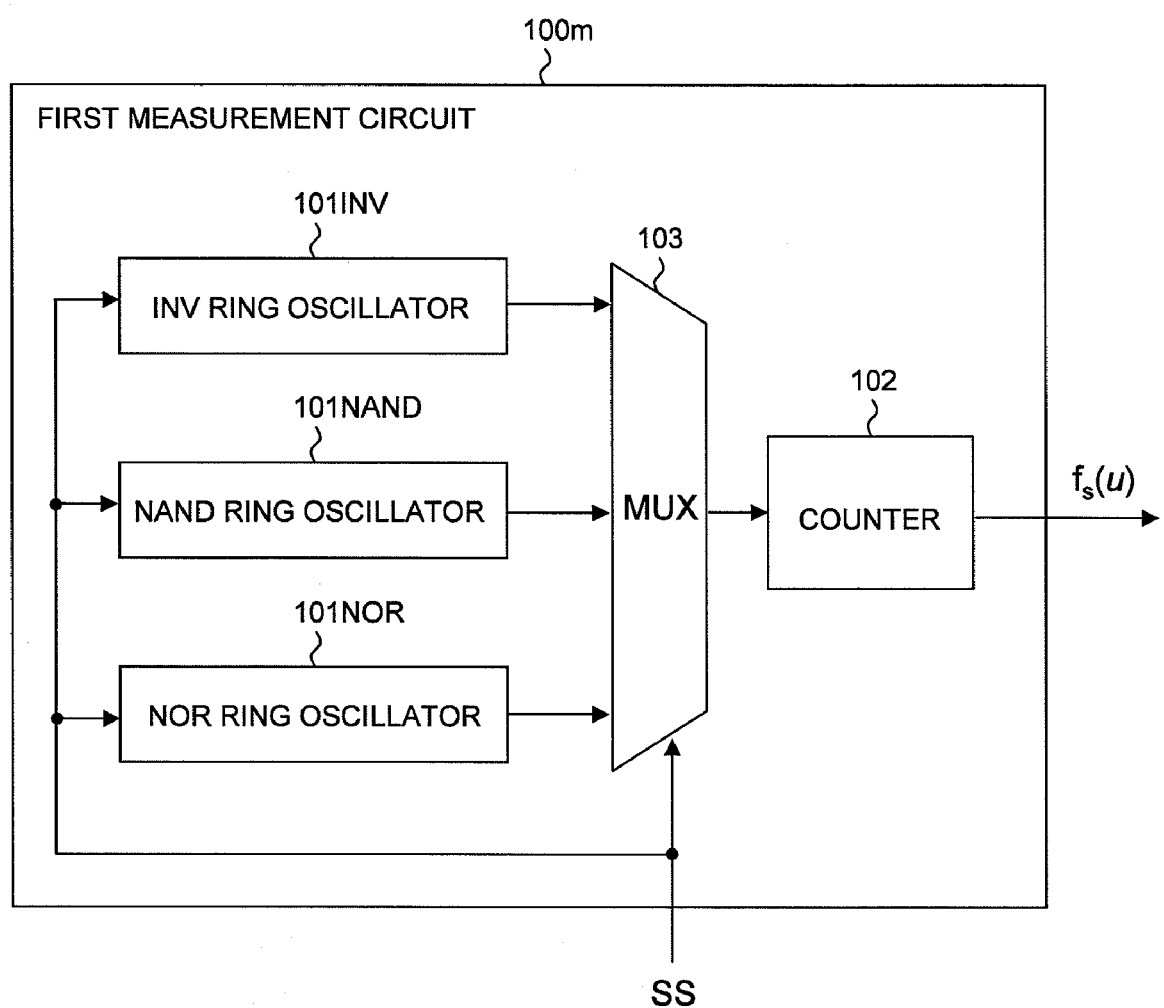
FIG. 14 is a block diagram showing a configuration of the first measurement circuit for measurement of variability in the system according to the second embodiment.

FIGS. 14 and 15 show other examples of the first measurement circuit for determining a relative value of the variability, and the second measurement circuit for determining a relative value of the uncertainty respectively, which are involved in a system according to the second embodiment of the invention.

The system according to the second embodiment has the feature that more than one ring oscillator is placed in each of the first and second measurement circuits 100m and 200m corresponding to more than one typical type of logic gates used in the internal circuit 400. Usually, more than one type of gates are incorporated in a logic circuit, and the variability and uncertainty of values of delays of the gates differ from each other in quantity. Therefore, it is preferable that the same number of ring oscillators as the number of the types of logic gates are prepared to sense variations for each gate. By making such arrangement, the timing of an action of an actual semiconductor integrated circuit can be reflected on the first and second measurement circuits more accurately than reflected on the first and second measurement circuits in the system according to the first embodiment, and thus a finer voltage control can be achieved. In the timing calculation executed by STA or SSTA tool, a value of delay caused by each gate can be determined accurately. However, in case that the result of calculation about variations which can be obtained concerns only one gate type as in the system according to the first embodiment, variations of delay about all the types of logic gates need to be estimated from the result of calculation of variations concerning the one gate type. Hence, if a value of delay can be sensed for each gate type, the need for so estimating is eliminated. However, preparing all type of gates used in a logic circuit is far from the truth, and therefore it is quite usual to limit the types of gates to prepare to typical ones.

The ring oscillators adopted for the first measurement circuit 100m of the example shown in FIG. 14 and the types of gates that the ring oscillators target for measurement are as follows: a ring oscillator 101INV for an inverter (INV), which is a typical type of logic gate; a ring oscillator 101NAND for NAND gate; and a ring oscillator 101NOR for NOR gate. Which type of gate to target for measurement is selected by the multiplexer (MUX) 103 using a select signal SS. For instance, in the case of selecting the output of the ring oscillator 101NAND incorporating NAND gate, only the ring oscillator 101NAND is caused to oscillate and the multiplexer 103 selects the output of the ring oscillator 101NAND for NAND gate, while the other ring oscillators 101INV and 101NOR are kept stopped from oscillating. The counter 102 shown in FIG. 14 is identical in structure with the counter 102 which has been described with reference to FIGS. 4 and 5. Therefore, the detailed description thereof is skipped here.

The ring oscillators adopted for the second measurement circuit 200m of the example shown in FIG. 15 and the types of gates that the ring oscillators target for measurement are as follows: ring oscillator pairs 201INV_1 to 201INV_M, each composed of a couple of ring oscillators 201AINV and 201BINV for an inverter (INV), which is a typical type of logic gate; ring oscillator pairs 201NAND_1 to 201NAND_M, each composed of a couple of ring oscillators 201ANAND and 201BNAND for NAND gate; and ring oscillator pairs 201NOR_1 to 201NOR_M, each composed of a couple of ring oscillators 201ANOR and 201BNOR for NOR gate. Which type of gate to target for measurement is selected using a select signal SR output by the controller 204m. For instance, in the case of selecting NAND gate, only the ring oscillators of the ring oscillator pairs 201NAND_1 to 201NAND_M are caused to oscillate, and the ring oscillators of the other ring oscillator pairs are kept stopped from oscillating. Moreover, the operation of the counter (A) 202A and counter (B) 202B, and the operation of the calculating unit 203, and other control actions of the controller 204m are the same as the operation of the counters 202A and 202B, the operation of the calculating unit 203, and other control actions of the controller 204 which have already described with reference to FIGS. 7 and 8. Therefore, the detailed descriptions thereof are skipped here.

In the example described above, the ring oscillator of the first measurement circuit and the ring oscillator pair of the second measurement circuit are changed according to the type of gate. However, the first and second measurement circuits may be arranged so that ring oscillators thereof are switched according to the threshold voltage of a transistor, because different threshold voltages of transistors lead to different extents of variation.

Third Embodiment

Figure 17:
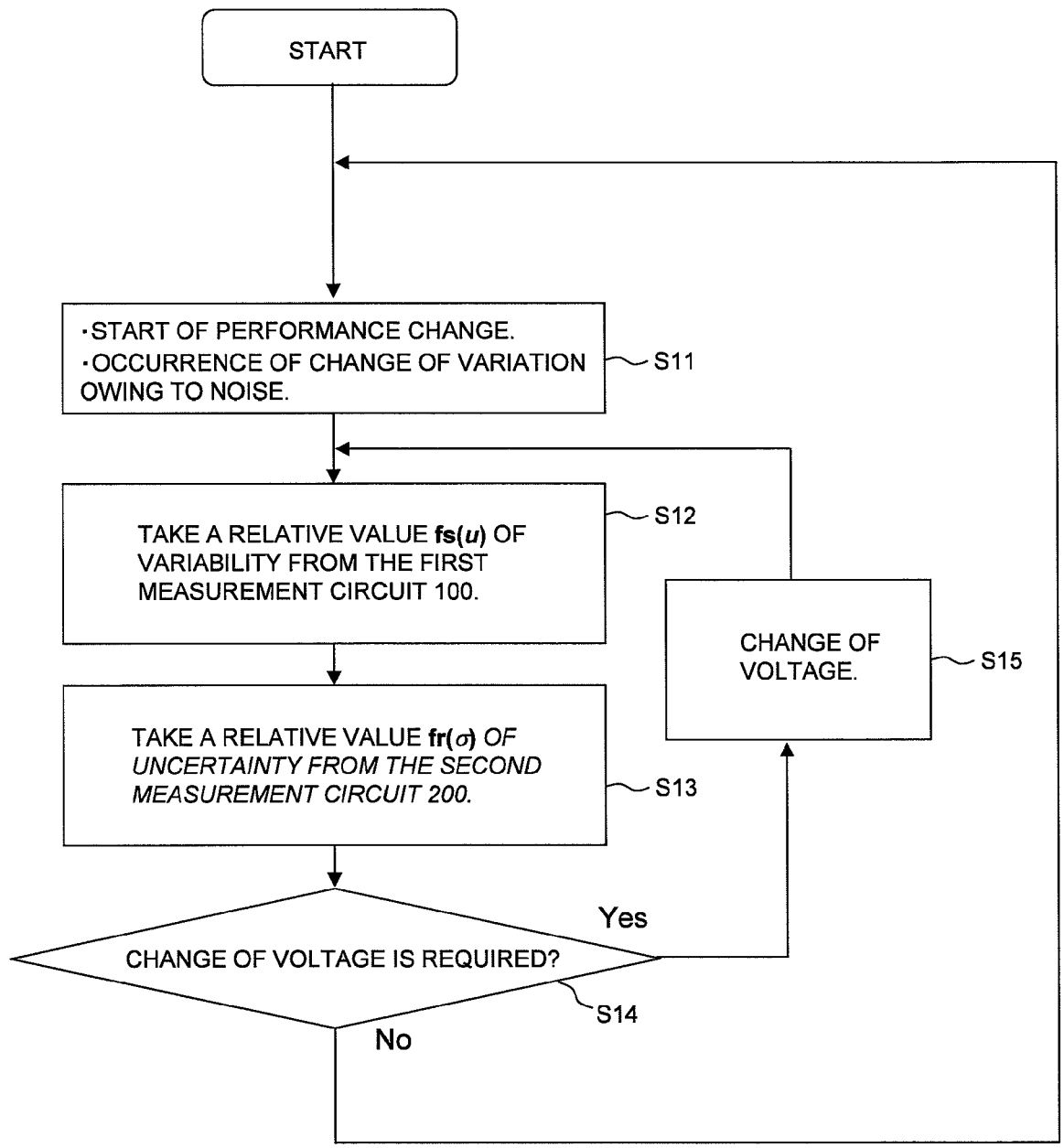
FIG. 17 is a flow chart showing the processing when executing the AVS through the use of a feedback loop in the system according to the third embodiment.

FIG. 16 shows an example of a correspondence table 304 involved in a system according to the third embodiment of the invention; the correspondence table is stored in the storing unit 301 of the control-information-preparing circuit 300, and presents correspondences between performances required of chips, and variations of the variability and uncertainty corresponding to the required performances. FIG. 17 shows an example of the operation flow of the adaptive voltage scaling through the use of a feedback loop using the correspondence table 304 shown by FIG. 16. The system according to the third embodiment is different from the systems according to the first and second embodiments in the structure of the correspondence table stored in the storing unit 301, and the detail of the processing for AVS (Adaptive Voltage Scaling), which the control-information-preparing circuit 300 executes. A feature which the system according to the third embodiment has is as follows. While the semiconductor integrated circuit is in action, variations of gate delay are measured and in parallel, the supply voltage is changed gradually by means of the feedback operation, whereby the performance in the processing speed of the semiconductor integrated circuit is brought near to the required one. The effect which the system arranged like this achieves is that the supply voltage can be corrected so that the influences of fluctuations of gate delay caused by the temperature fluctuation, power-source noise and the like occurring while the semiconductor integrated circuit is working are canceled out.

To conduct the adaptive voltage scaling through the use of a feedback loop, variations of the variability and uncertainty need to be stored according to the required performance. An example of the collection of data prepared by addressing the need is the table shown in FIG. 16. The correspondence table of variation values concerning the variability and uncertainty according to required performances is prepared in the design phase in advance. For instance, if the required performance is 800 MHz or higher, the supply voltage is controlled so that the relative value fs(u) of the variability becomes a value of Sh or larger, and so that the relative value fr(σ) of the uncertainty becomes a value of Rh or smaller. Then, the supply voltage is set to the lowest value of voltage values which can achieve required variation values.

The correspondence table 304 is made up of target-value table data; in the table, a relative value fs(u) provided by the first measurement circuit 100 and a relative value fr(σ) provided by the second measurement circuit 200 which can achieve a minimum supply voltage necessary for meeting each requirement of speed performance required of the internal circuit 400 are brought together as the target relative values per a plurality of speed performance. The higher the required speed performance is, the larger the relative value fs(u) provided by the first measurement circuit 100 is. In contrast, the higher the required speed performance is, the smaller the relative value fr(σ) provided by the second measurement circuit 200 is.

When executing the adaptive voltage scaling, the control-information-preparing circuit 300 prepares the control information VCNT, showing whether or not the requirements of target relative values corresponding to a desired processing speed in the target-value table data are met. Next, a method for controlling the supply voltage using the control information VCNT thus prepared will be described with reference to FIG. 17.

As shown in FIG. 17, in case that the change of the required performance is started, or that noise causes a change of variation (S11), variations are generated owing to noise, the first measurement circuit 100 for determining a relative value of variability is first activated, thereby to take the relative value fs(u) of variability (S12). Next, the second measurement circuit 200 for determining a relative value of uncertainty is activated, and thus a relative value fr(σ) of uncertainty is gained (S13). The first and second measurement circuits 100 and 200 may be worked in parallel to save time. However, if power-source noise and the like are caused by working one of the first and second measurement circuits, whereby the result of sensing by the other measurement circuit is negatively affected, it is better to operate the first and second measurement circuits in series as performed in the flow shown in FIG. 17. The control-information-preparing circuit 300 makes a judgment on whether or not variations of variability and uncertainty have reached respective required values (S14). If variations of variability and uncertainty have not reached the required values, changing the supply voltage becomes a must and therefore, the supply voltage is changed (S15). As the amount of change in the supply voltage at time of the change, a small fixed value, and an amount of change based on PID control theory are conceivable. In the end, the control processing is terminated at the time when the control-information-preparing circuit 300 confirms that the variation has reached a required value. Alternatively, even in case that the control-information-preparing circuit 300 remains being out of action, the following steps may be performed: causing the first and second measurement circuits 100 and 200 to work at intervals of a fixed length of time; keeping checking whether or not a variation falls within bounds of meeting a requirement of performance at all times; changing the supply voltage on condition that the variation is outside the bounds.

Thus, it becomes possible to dynamically correct the supply voltage to meet a requirement of a desired speed performance even when a gate delay fluctuation occurs owing to e.g. the temperature fluctuation, power-source noise occurring in a working semiconductor integrated circuit, and the secular change of a property of the semiconductor integrated circuit.

Fourth Embodiment

Figure 18:
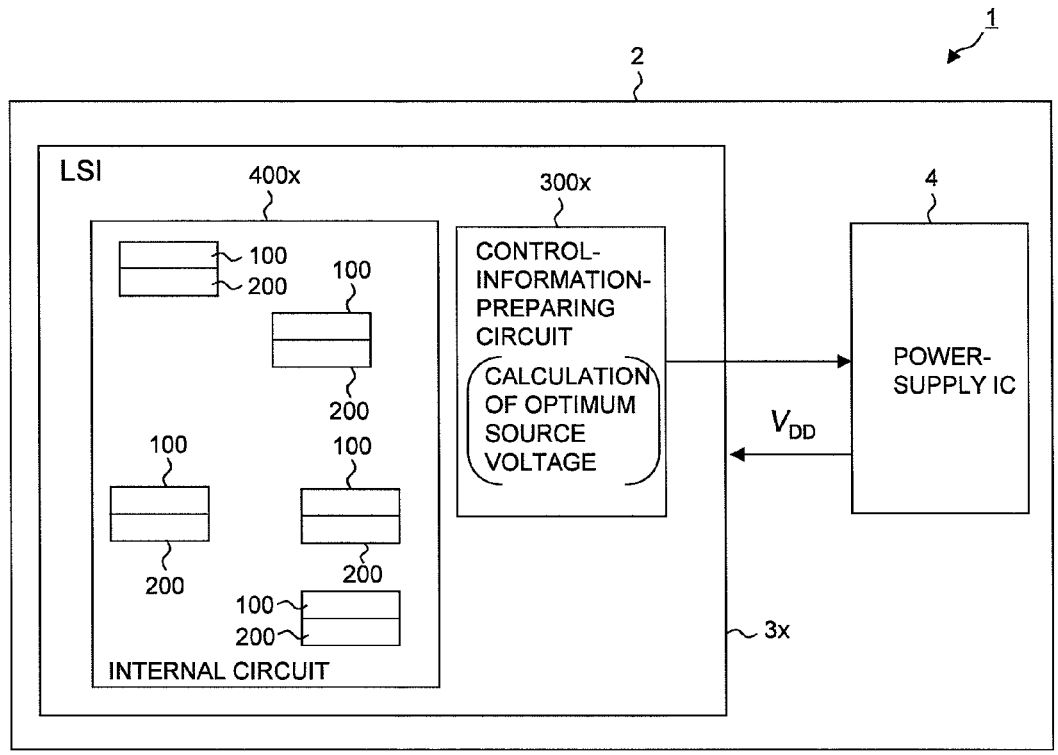
FIG. 18 is a block diagram showing a system configuration for executing AVS according to measurement results by lots of measurement circuits in the system according to the fourth embodiment.

FIG. 18 shows an example of a semiconductor integrated circuit 3x according to the fourth embodiment of the invention. The semiconductor integrated circuit 3x has an internal circuit 400x, and a control-information-preparing circuit 300x. In the internal circuit 400x, more than one pair of first and second measurement circuits 100 and 200 are disposed in dispersed places, provided that the first and second measurement circuits are identical with the first and second measurement circuits 100 and 200 associated with the preceding embodiments in functions. The control-information-preparing circuit 300x selectively uses one pair of relative values of outputs of the more than one pair of the first and second measurement circuits 100 and 200 to prepare the control information; the selectively used one pair of outputs are the largest in change of variation. Thanks to the layout of the more than one pair of the first and second measurement circuits disposed in dispersed places, it is possible to readily handle even a situation that the gate delay varies depending on a portion of the semiconductor integrated circuit. Also, it is possible to appropriately treat a local change of variation as caused by a local heating of a chip in a way according to AVS (Adaptive Voltage Scaling). By executing AVS (Adaptive Voltage Scaling) based on measurement results output by the one pair of first and second measurement circuits 100 and 200, which are selected from among the more than one pair of first and second measurement circuits 100 and 200, and which are the largest in change of variation, the semiconductor integrated circuit 3x is allowed to work correctly.

Fifth Embodiment

Figure 19:
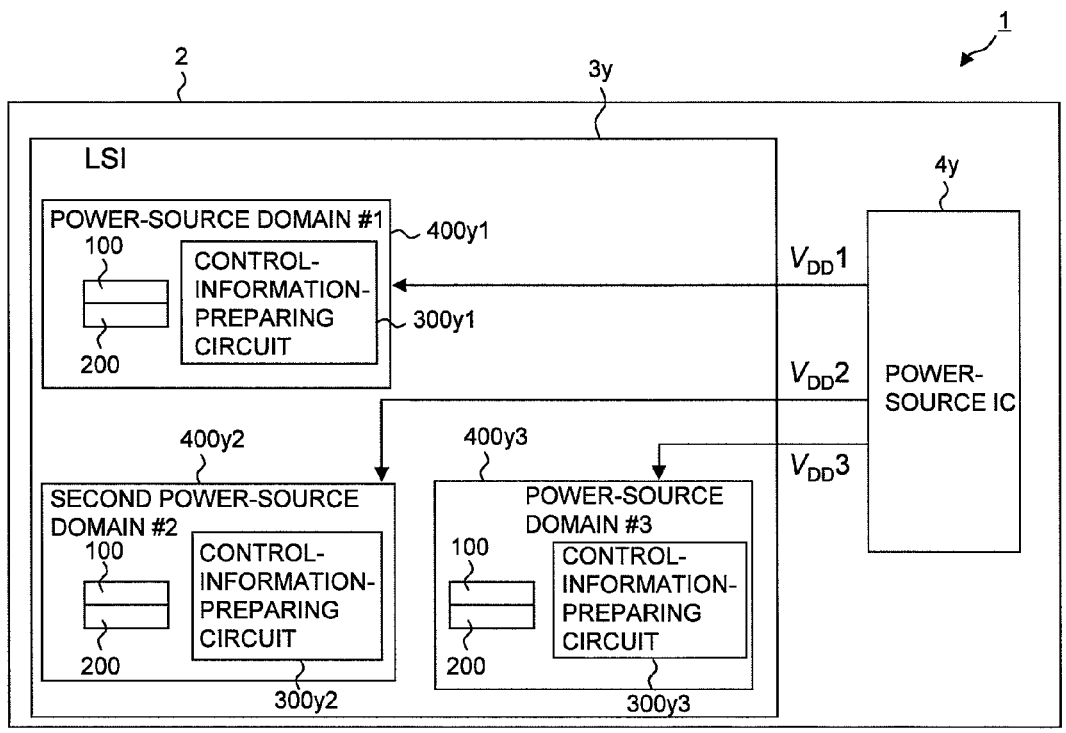
FIG. 19 is a block diagram showing a system configuration for executing AVS with power-source domains put on an intra-die in the system according to the fifth embodiment.

FIG. 19 shows an example of a semiconductor integrated circuit 3y according to the fifth embodiment of the invention. The semiconductor integrated circuit 3y has power-source domains 400y1, 400y2 and 400y3 respectively supplied with supply voltages $V_{DD}1$, $V_{DD}2$ and $V_{DD}3$, in which each power-source domain has an internal circuit, the first and second measurement circuits 100 and 200, and the control-information-preparing circuit 300y1, 300y2 or 300y3. The power-supply IC 4y accepts input of a pair of relative values for each power-source domain. Then, according to the input pair of relative values, the power-supply IC 4y supplies the supply voltages $V_{DD}1$, $V_{DD}2$ and $V_{DD}3$ to the corresponding power-source domains. In this way, supplies of supply voltages to the power-source domains which need different supply voltages respectively can be controlled adaptively. While the variation of variability is regard as being uniform within a chip usually, the variability can involve a small unevenness in fact. In other words, the power-source domains are different in variability and uncertainty. According to the fifth embodiment, AVS (Adaptive Voltage Scaling) according to the magnitude of variability, and the magnitude of uncertainty can be conducted for each power-source domain. Therefore, the power consumed by an entire chip can be reduced further. However, in case that the number of power-source domains, which are different divisions, is excessively large, the formation of the divisions causes an areal overhead, and there is a relation of tradeoff between the number of power-source domains and the effect of power reduction.

Sixth Embodiment

Figure 20:
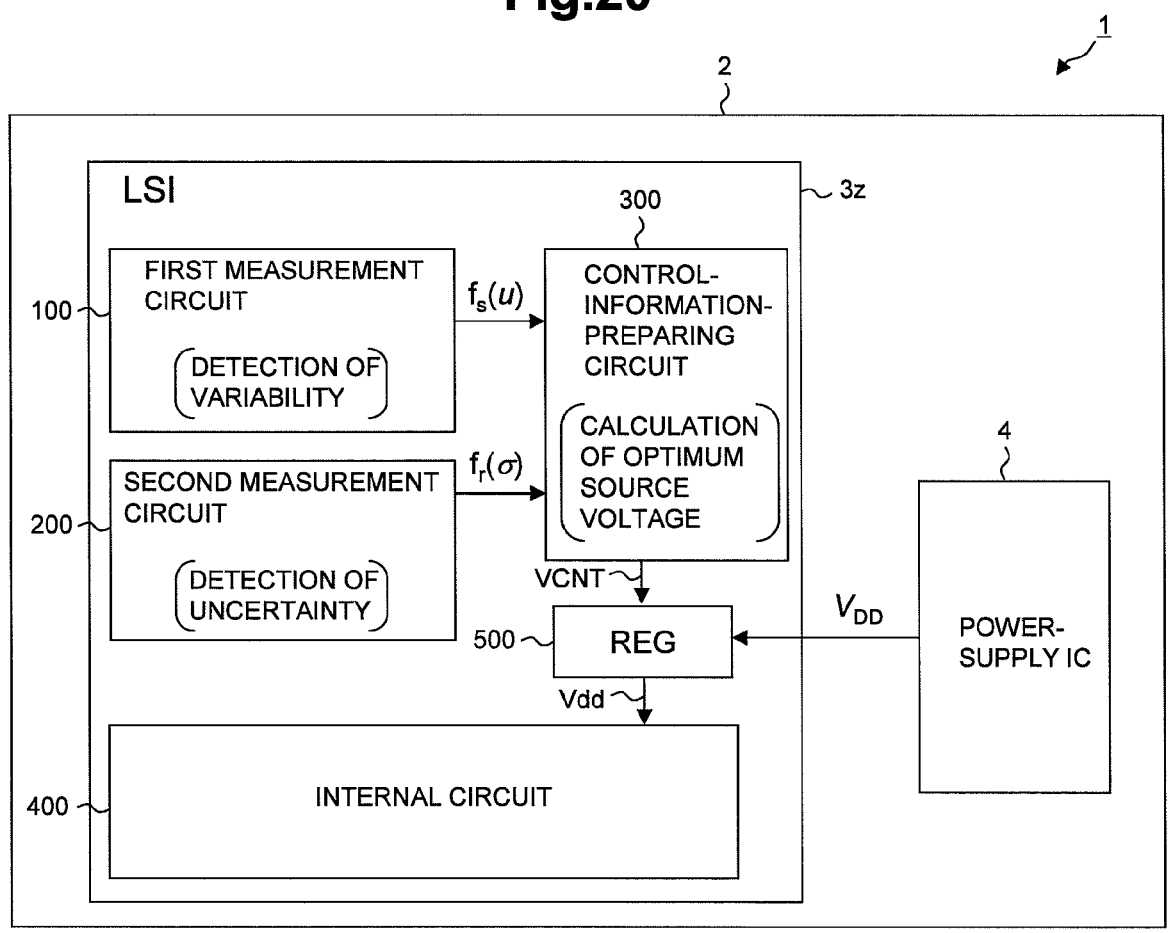
FIG. 20 is a block diagram showing a system configuration for executing AVS with an on-chip voltage regulator incorporated therein in the system according to the sixth embodiment.

FIG. 20 shows an example of a semiconductor integrated circuit 3z according to the sixth embodiment of the invention.

Here, the system configuration for executing AVS (Adaptive Voltage Scaling) with an on-chip voltage regulator mounted on the system will be described with reference to the drawing. The system configuration is similar to the system configuration according to the first embodiment shown in FIG. 1, but is different in the following points. The first is that a voltage regulator (REG) 500 is added thereto. The second is that control information VCNT determined by the control-information-preparing circuit 300 is sent to not the power-supply IC 4, but the on-chip voltage regulator 500. The voltage regulator 500 controls the level of an internal supply voltage Vdd with respect to the external supply voltage VDD based on the control information VCNT.

As described above, in the system according to the sixth embodiment, the change to the supply voltage for the internal circuit 400 is not controlled by the external power-supply IC 4 outside the chip, but performed by the on-chip voltage regulator 500. According to the sixth embodiment, the voltage change latency can be shortened. It takes the following time to use the external power-supply IC 4 to change the supply voltage: time involved in the communication with the power-supply IC 4; time required for the power-supply IC 4 to change the voltage; and time required for voltage produced by the change to reach the internal circuit 400. To cut these kinds of time, it is preferable to use the on-chip voltage regulator 500 to make the voltage change. By doing so, the time for communication, and the time required for voltage produced by the change to reach the internal circuit can be reduced. It is common to adopt a switching power supply for the external power-supply IC 4, and a series power supply for the on-chip voltage regulator 500. Therefore, the on-chip voltage regulator 500 can cut the time required for the power-supply IC 4 to change the voltage in general. In countering a steep change of gate delay variation, such as power-source noise, it is suitable to use the on-chip voltage regulator 500 because of its short voltage change latency. However, attention must be paid as to the fact that use of the on-chip voltage regulator 500 causes an areal overhead, and a reduction of the voltage conversion rate.

While the embodiments of the invention made by the inventor have been described above concretely, the invention is not limited to the embodiments. It is obvious that various changes and modification may be made without departing from the scope of the invention.

What is claimed is:

1. A semiconductor integrated circuit formed in a semiconductor chip, comprising:
    an internal circuit;
    a measurement circuit operable to prepare statistical information about a delay depending on a local property of the internal circuit; and
    a control-information-preparing circuit operable to prepare control information for deciding a supply voltage for the internal circuit based on a result of measurement by the measurement circuit,
    wherein the measurement circuit includes a first measurement circuit operable to create a relative value with respect to a gate delay mean value in the internal circuit, and
        a second measurement circuit operable to create a relative value related to a gate delay standard deviation in the internal circuit, and
    the control-information-preparing circuit prepares the control information based on the relative values created by the first and second measurement circuits respectively.

2. The semiconductor integrated circuit according to claim 1, wherein the first measurement circuit includes a first ring oscillator unit for measuring an oscillation frequency used at time of creating a relative value with respect to a gate delay mean value, and the first ring oscillator unit includes at least one ring oscillator,
    the second measurement circuit includes a second ring oscillator unit for measuring an oscillation frequency used at time of creating the relative value related to the gate delay standard deviation, and the second ring oscillator unit includes at least one group of pairs of ring oscillators, and
    a number of delay stages of the ring oscillator of the first measurement circuit is larger than a number of delay stages of each ring oscillator pair of the second measurement circuit.

3. The semiconductor integrated circuit according to claim 2, wherein the control-information-preparing circuit holds table data referred to at time of preparing the control information based on the relative values provided by the first and second measurement circuits respectively.

4. The semiconductor integrated circuit according to claim 3, wherein the control-information-preparing circuit has a non-volatile storage circuit which stores, as the table data, translation table data to refer to for searching for a value of target voltage fitting conditions specified by the relative values provided by the first and second measurement circuits respectively, using the relative values as indexes at time of activation of the internal circuit using a first supply voltage, and
    the control-information-preparing circuit sets, as the control information, information of the target voltage value determined as a result of the searching.

5. The semiconductor integrated circuit according to claim 4, wherein the target voltage becomes higher as the relative value provided by the first measurement circuit becomes smaller, and
    the target voltage becomes higher as the relative value provided by the second measurement circuit becomes larger.

6. The semiconductor integrated circuit according to claim 3, wherein the control-information-preparing circuit has a non-volatile storage circuit operable to store, as the table data, target-value table data,
    in the target-value table data, a combination of the relative value provided by the first measurement circuit and the relative value provided by the second measurement circuit, which can achieve a minimum supply voltage necessary for meeting each requirement of speed performance required of the internal circuit, are brought together as target relative values per a plurality of speed performance, and
    the control-information-preparing circuit sets, as the control information, information showing whether or not the relative values provided by the first and second measurement circuits fit requirements of the target relative values of the target-value table data corresponding to a desired processing speed.

7. The semiconductor integrated circuit according to claim 6, wherein the target relative value for the relative value provided by the first measurement circuit becomes larger as the required speed performance rises, and
    the target relative value for the relative value provided by the second measurement circuit becomes smaller as the required speed performance rises.

8. The semiconductor integrated circuit according to claim 4, wherein the non-volatile storage circuit is composed of one of a semiconductor memory and a programmable-fuse circuit.

9. The semiconductor integrated circuit according to claim 2, wherein the first ring oscillator unit of the first measurement circuit has ring oscillators including the at least one ring oscillator, and the ring oscillators correspond, in number, to typical logic gate types involved in the internal circuit, the second ring oscillator unit of the second measurement circuit includes groups of ring oscillator pairs including the at least one group of ring oscillator pairs, and the ring oscillator pair groups correspond, in number, to the typical logic gate types, the first measurement circuit uses an output of one ring oscillator selected from among the ring oscillators located therein, and creates the relative value, and the second measurement circuit uses an output of one ring oscillator pair group selected from among the ring oscillator pair groups located therein, and creates the relative value.

10. The semiconductor integrated circuit according to claim 1, wherein the measurement circuit has more than one pair of the first and second measurement circuits, the control-information-preparing circuit selectively uses one pair of relative values of outputs of the more than one pair of the first and second measurement circuits to prepare the control information, and the selectively used one pair of outputs are the largest in change of variation.

11. The semiconductor integrated circuit according to claim 1, wherein the semiconductor chip has a plurality of power-source domains which accept supplies of different supply voltages, and each power-source domain has the internal circuit, the measurement circuit, and the control-information-preparing circuit.

12. The semiconductor integrated circuit according to claim 1, further comprising an external interface circuit operable to output the control information to outside the semiconductor chip.

13. The semiconductor integrated circuit according to claim 1, further comprising a voltage regulator which accepts input of an external supply voltage supplied through an external power-source terminal of the semiconductor chip, and generates the supply voltage, wherein the voltage regulator controls the level of the supply voltage with respect to the external supply voltage based on the control information.

14. The semiconductor integrated circuit according to claim 2, wherein the first measurement circuit has a first ring oscillator, and a counter which accepts input of an oscillating output of the first ring oscillator, counts oscillating outputs in a predetermined cycle, and outputs a counted value resulting from the count-up as a relative value with respect to the gate delay mean value.

15. The semiconductor integrated circuit according to claim 14, wherein the relative value with respect to the gate delay mean value is given by:

$fs(u) = CLKP/(\alpha \times N1 \times u)$, where fs(u) is the relative value with respect to the gate delay mean value, u is the gate delay mean value, CLKP is the predetermined cycle, N1 is a number of gate stages of the first ring oscillator, and α (=2) is a constant.

16. The semiconductor integrated circuit according to claim 14, wherein the second measurement circuit has: a plurality of pairs of second ring oscillators; a pair of counters operable to count oscillating outputs of the second ring oscillators of each ring oscillator pair, respectively; a calculating circuit operable to perform a calculation on receipt outputs of the pair of counters; and a control circuit, the control circuit supplies the pair of counters with oscillating outputs of each pair of second ring oscillators while switching among the ring oscillator pairs, and the control circuit performs an action to cause the pair of counters to begin a counting action starting with initial values each time of the switching, and the action to cause the pair of counters to begin counting is repeated M times, provided that M is a total number of the ring oscillator pairs, and each time one of the paired counters having started counting reaches a maximum value, the calculating unit logically inverts a counted value that the other counter holds at that time, and determines a relative value related to the gate delay standard deviation based on a value derived by averaging squares of logically inverted values.

17. The semiconductor integrated circuit according to claim 16, wherein the relative value related to the gate delay standard deviation is given by:

$fr(\sigma) = fbbs/(\beta \times MVC^2 \times M \times N2)$, where fr(σ) is the relative value related to the gate delay standard deviation, fbbs is the value derived by averaging squares of the logically inverted values, MVC is the maximum value of the counter, N2 is a number of gate stages of the second ring oscillator, and β (=4) is a constant.

18. An electronic device, comprising:
a mounting board;
a semiconductor integrated circuit on the mounting board;
a power-source circuit operable to supply a supply voltage to the semiconductor integrated circuit, the power-source circuit mounted on the mounting board, wherein the semiconductor integrated circuit include an internal circuit, a measurement circuit operable to prepare statistical information about a delay depending on a local property of the internal circuit; and a control-information-preparing circuit operable to prepare control information for deciding a supply voltage for the internal circuit based on a result of measurement by the measurement circuit, the internal circuit, measurement circuit, and a control-information-preparing circuit are included in a semiconductor chip, the measurement circuit includes a first measurement circuit operable to create a relative value with respect to a gate delay mean value in the internal circuit, and a second measurement circuit operable to create a relative value related to a gate delay standard deviation in the internal circuit, and the control-information-preparing circuit supplies the power-source circuit with information of a target voltage value searched for using a translation table data, as the control information, the translation table data for holding information of target voltage values, which is referred to using, as indexes, the relative values provided by the first and second measurement circuits, at time of activation of the internal circuit using a first supply voltage supplied from the power-source circuit, and the power-source circuit supplies the semiconductor integrated circuit with the supply voltage having a voltage value specified by the supplied control information.

19. An electronic device, comprising:
a mounting board;
a semiconductor integrated circuit on the mounting board;
a power-source circuit operable to supply a supply voltage to the semiconductor integrated circuit, the power-supply circuit mounted on the mounting board, wherein the semiconductor integrated circuit include an internal circuit, a measurement circuit operable to prepare statistical information about a delay depending on a local property of the internal circuit; and a control-information-preparing circuit operable to prepare control information for deciding a supply voltage for the internal circuit based on a result of measurement by the measurement circuit, the internal circuit, measurement circuit, and a control-information-preparing circuit are included in a semiconductor chip, the measurement circuit includes a first measurement circuit operable to create a relative value with respect to a gate delay mean value in the internal circuit, and a second measurement circuit operable to create a relative value related to a gate delay standard deviation in the internal circuit, and the control-information-preparing circuit has a non-volatile storage circuit operable to store target-value table data, in the target-value table data, a combination of the relative value provided by the first measurement circuit and the relative value provided by the second measurement circuit, which can achieve a minimum supply voltage necessary for meeting each requirement of speed performance required of the internal circuit, are brought together as target relative values per a plurality of speed performance, the control-information-preparing circuit supplies the power-source circuit with, as the control information, information showing whether or not the relative values provided by the first and second measurement circuits fit requirements of the target relative values of the target-value table data corresponding to a desired processing speed, and the power-source circuit performs control to change the supply voltage to supply to the semiconductor integrated circuit on condition that the supplied control information shows that the requirement for a target relative value has not been satisfied.

* * * * *